United States Patent
Inoue

(10) Patent No.: US 7,383,523 B2
(45) Date of Patent: Jun. 3, 2008

(54) SEMICONDUCTOR INTEGRATED CIRCUIT

(75) Inventor: Genichiro Inoue, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 287 days.

(21) Appl. No.: 11/239,466

(22) Filed: Sep. 30, 2005

(65) Prior Publication Data

US 2006/0066357 A1 Mar. 30, 2006

(30) Foreign Application Priority Data

Sep. 30, 2004 (JP) ............................. 2004-287056
Sep. 13, 2005 (JP) ............................. 2005-265444

(51) Int. Cl.
*G06F 17/50* (2006.01)

(52) U.S. Cl. .................... 716/6; 716/4; 716/5

(58) Field of Classification Search ................. 716/4–6
See application file for complete search history.

(56) References Cited

U.S. PATENT DOCUMENTS

| | | | | |
|---|---|---|---|---|
| 4,213,064 A | * | 7/1980 | Frosch et al. ............... 327/160 |
| 4,588,944 A | * | 5/1986 | Rothenberger ............. 714/731 |
| 5,592,493 A | * | 1/1997 | Crouch et al. .............. 714/729 |
| 5,717,700 A | * | 2/1998 | Crouch et al. .............. 714/726 |
| 5,719,878 A | * | 2/1998 | Yu et al. .................... 714/726 |
| 5,729,152 A | * | 3/1998 | Leung et al. ................ 326/21 |
| 5,748,543 A | * | 5/1998 | Lee et al. ................... 365/200 |
| 5,774,476 A | * | 6/1998 | Pressly et al. .............. 714/726 |
| 6,031,981 A | * | 2/2000 | Lee et al. .................... 716/10 |
| 6,255,845 B1 | * | 7/2001 | Wong et al. ................. 326/38 |
| 6,333,656 B1 | * | 12/2001 | Schober ..................... 327/202 |
| 6,440,780 B1 | * | 8/2002 | Kimura et al. .............. 438/129 |
| 6,486,705 B2 | * | 11/2002 | Andrews et al. ............. 326/93 |
| 6,600,341 B2 | * | 7/2003 | Bingert et al. .............. 326/102 |
| 6,654,939 B2 | * | 11/2003 | Yamamoto et al. ............ 716/6 |
| 6,774,674 B2 | * | 8/2004 | Okamoto et al. ............. 326/80 |
| 6,791,355 B2 | * | 9/2004 | Vergnes ..................... 326/41 |
| 6,934,921 B1 | * | 8/2005 | Gu et al. ..................... 716/6 |
| 7,120,844 B2 | * | 10/2006 | Wu ........................... 714/731 |
| 7,131,081 B2 | * | 10/2006 | Wang et al. ................. 716/4 |
| 7,331,028 B2 | * | 2/2008 | Dinter et al. ................ 716/11 |
| 2004/0064770 A1 | * | 4/2004 | Xin ............................ 714/726 |
| 2004/0080334 A1 | * | 4/2004 | Vergnes ..................... 326/10 |
| 2004/0205427 A1 | * | 10/2004 | Ichikawa .................... 714/710 |
| 2004/0230933 A1 | * | 11/2004 | Weaver et al. ............... 716/12 |
| 2005/0057292 A1 | * | 3/2005 | Sidiropoulos ............... 327/233 |
| 2005/0229133 A1 | * | 10/2005 | Goto et al. .................. 716/10 |
| 2006/0031796 A1 | * | 2/2006 | Meaney ....................... 716/6 |

FOREIGN PATENT DOCUMENTS

JP 2000-150659 5/2000

* cited by examiner

*Primary Examiner*—Vuthe Siek
*Assistant Examiner*—Naum B Levin
(74) *Attorney, Agent, or Firm*—McDermott Will & Emery LLP

(57) ABSTRACT

To provide a semiconductor integrated circuit in which a clock signal supplied to each flip-flop will not be adversely affected when a functional change is made using a spare flip-flop. The semiconductor integrated circuit includes a plurality of main flip-flops which contribute to a predetermined function, a plurality of spare flip-flops, and a clock tree synthesis circuit that generates a clock signal which is adjusted for synchronizing the plurality of main flip-flops and the plurality of spare flip-flops and supplies the adjusted clock signal to the plurality of main flip-flops and the plurality of spare flip-flops.

10 Claims, 16 Drawing Sheets

SEMICONDUCTOR INTEGRATED CIRCUIT

This application is based on applications Ser. No. 2004-287056 and 2005-265444 filed in Japan, the contents of which are hereby incorporated by reference.

BACKGROUND OF THE INVENTION

1. Field of the Invention

The present invention relates to a semiconductor integrated circuit in which spare flip-flops are contained beforehand as repair cells.

2. Related Art

With a rapid expansion of the market of products that carry semiconductor integrated circuits in recent years, the semiconductor integrated circuit products are increasingly diversified and sophisticated and their life cycles are shortening. Under such circumstances, short-term development and high functionality are required of semiconductor integrated circuits.

Also, as semiconductor manufacturing technologies progress, a large-scale circuit previously uncontainable in a single semiconductor integrated circuit chip can now be implemented in a single semiconductor integrated circuit chip through microfabrication.

This creates a demand for semiconductor integrated circuit design techniques that enable an enormous size of circuit to be packed on a single semiconductor integrated circuit chip in a short time.

The use of a most advanced microfabrication technique in semiconductor integrated circuit design has advantages such as reducing a total semiconductor cost in a product system and allowing a large-scale circuit to be packed on a single semiconductor integrated circuit chip, but also has disadvantages such as a longer diffusion period, a higher mask price, greater difficulty in timing design for signal integrity, and a longer functional inspection period.

In view of this, the following method is conventionally used to develop a high-performance large-scale semiconductor integrated circuit in a short time. In addition to logic circuits that achieve a predetermined function, logic circuits for functional changes are placed beforehand in a semiconductor integrated circuit as repair cells, so that a functional change can be easily made in a short time by changing a wiring layer after placement of an order for masks for composing transistors.

Japanese Patent Application Publication No. 2000-150659 discloses one example of layout design method that uses repair cells.

According to this method, in an initial circuit design stage, spare standard cells for circuit changes are inserted in a layout in anticipation of circuit changes which may later become necessary, so that a circuit change can be made to remove a timing constraint violation or the like found after layout design or manufacture of a semiconductor integrated circuit. This being so, when a circuit change becomes necessary, the change can be made by using only a repair standard cell and wiring.

According to this conventional technique, the spare standard cells are placed beforehand, so that a circuit change can be made by using only a spare standard cell and wiring. However, to supply a clock signal to the spare standard cell used for the circuit change, it is necessary to form a new wire for supplying the clock signal to the spare standard cell. This may disturb the balance in timing adjustment of the clock signal supplied to main standard cells used for achieving the original function of the semiconductor integrated circuit.

Also, crosstalk may occur between the new wire and its neighboring signal line, which can further disturb the balance in timing adjustment of the clock signal.

Due to these problems, it is difficult to perform a circuit change without disturbing synchronization. This makes it impossible to reduce a design time.

SUMMARY OF THE INVENTION

To solve the above problems, the present invention aims to provide a semiconductor integrated circuit in which a clock signal supplied to each flip-flop will not be adversely affected even when a design of the semiconductor integrated circuit is changed to use a spare flip-flop. The present invention also aims to provide a manufacturing method for such a semiconductor integrated circuit.

The stated aim can be achieved by a semiconductor integrated circuit designed to realize a predetermined function, including: a plurality of main flip-flops used for realizing the predetermined function; a plurality of spare flip-flops; and a clock adjustment circuit operable to generate a clock signal which is adjusted for synchronizing the plurality of main flip-flops and the plurality of spare flip-flops, and supply the adjusted clock signal to the plurality of main flip-flops and the plurality of spare flip-flops.

With this construction, the clock signal adjusted for synchronization is supplied to the plurality of spare flip-flops beforehand. This produces an excellent effect of preventing the clock signal supplied to each flip-flop from being adversely affected when a wiring design is changed to use a spare flip-flop.

Therefore, even when a functional change becomes necessary to resolve a defect, there is no need to readjust the clock signal supplied to each flip-flop, which represents a saving in design time.

Here, a data input terminal of each of the plurality of spare flip-flops may receive an input of a fixed logical value.

Here, a data output terminal of each of the plurality of spare flip-flops may be unconnected to any terminal.

Here, a data output terminal of each of the plurality of spare flip-flops may be unconnected to any terminal of another flip-flop except a scan input terminal.

It should be obvious that in the case where the data output terminal of a spare flip-flop is connected to the scan input terminal of another flip-flop, a buffer circuit and/or an inverter circuit may be interposed therebetween.

With these constructions, the plurality of spare flip-flops are not in use and do not contribute to the predetermined function. Hence any of the plurality of spare flip-flops can be put to use for another purpose by a subsequent design change.

Here, the semiconductor integrated circuit may further include at least one of a scan path wire and a scan control signal wire, the scan path wire connecting the plurality of main flip-flops and the plurality of spare flip-flops in series, and the scan control signal wire being connected to each of the plurality of main flip-flops and each of the plurality of spare flip-flops.

With this construction, a scan path test can be easily performed on the plurality of main flip-flops and the plurality of spare flip-flops.

According to the conventional technique, when a functional change is made to use a spare flip-flop and that spare flip-flop is subjected to a scan path test in order to increase a defect detection rate, crosstalk may occur between wires added for scan path connection and scan control signal connection of the spare flip-flop and their neighboring signal lines, which can disturb synchronization. The present invention solves this problem.

Here, the semiconductor integrated circuit may be composed of a plurality of functional blocks, wherein the plurality of spare flip-flops are contained in a functional block in which the plurality of main flip-flops are contained, or in a neighboring functional block of the functional block.

With this construction, the plurality of spare flip-flops are positioned in the same functional block as the plurality of main flip-flops or in its neighborhood. Accordingly, when it becomes necessary to change a function of the functional block or add a new function, such a functional change can be achieved by short wiring.

Here, the semiconductor integrated circuit may further include a clock supply control circuit, wherein the functional block includes a plurality of subblocks which each operate in a predetermined period, and the clock supply control circuit is operable to control supply of the clock signal to each of the plurality of subblocks.

With this construction, the supply of the clock signal to each subblock is controlled so that each subblock can individually be started or stopped. Therefore, by disabling the clock signal to a subblock which is not in operation, power can be saved.

Here, the plurality of main flip-flops and the plurality of spare flip-flops may be contained in a subblock out of the plurality of subblocks, wherein the clock supply control circuit stops supplying the clock signal to the subblock in a period when the subblock does not operate.

With this construction, the clock signal to the subblock which contains both the plurality of main flip-flops and the plurality of spare flip-flops can be disabled to stop the subblock.

Here, the clock supply control circuit may include a logic circuit operable to supply or stop supplying the clock signal to each of the plurality of subblocks according to an enable signal.

With this construction, each subblock can be individually started or stopped according to an enable signal.

Here, the plurality of spare flip-flops may be contained in a different subblock from the plurality of main flip-flops, wherein the clock supply control circuit includes a logic circuit operable to supply or stop supplying the clock signal to the subblock according to an enable signal.

With this construction, the subblock which contains the plurality of spare flip-flops can be started or stopped according to an enable signal. This reduces the power consumption of the semiconductor integrated circuit when no spare flip-flop is being used. Also, once a change has been made in wiring design to use a spare flip-flop, the clock signal is supplied to the subblock.

Here, the enable signal may indicate to stop supplying the clock signal, wherein the logic circuit continuously stops supplying the clock signal to the subblock according to the enable signal.

With this construction, the subblock which contains the plurality of spare flip-flops is stopped according to an enable signal indicating to disable the clock signal. This reduces the power consumption of the semiconductor integrated circuit when no spare flip-flop is being used.

Here, the clock adjustment circuit may include a plurality of clock buffers arranged in a tree form.

With this construction, the plurality of clock buffers are arranged in a tree form, to generate the clock signal which is adjusted for synchronization of the plurality of main flip-flops and the plurality of spare flip-flops.

Thus, the semiconductor integrated circuit of the present invention supplies the clock signal adjusted for synchronization to the plurality of main flip-flops and the plurality of spare flip-flops beforehand, even when no functional change has yet been made to use a spare flip-flop.

The clock signal supplied to the plurality of spare flip-flops may be subjected to clock gating. Such a gated clock signal may be exclusively used for the plurality of spare flip-flops.

Also, scan path connection and scan control signal connection for the plurality of spare flip-flops may be provided so as to perform a scan path test on the plurality of spare flip-flops, even when no functional change has yet been made to use a spare flip-flop.

According to the present invention, the clock signal adjusted for synchronization is supplied to the plurality of spare flip-flops beforehand. Therefore, even if a functional change becomes necessary due to the discovery of a defect, there is no need to readjust the clock signal. This represents a saving in design time.

The stated aim can also be achieved by a manufacturing method for a semiconductor integrated circuit designed to realize a predetermined function, including the steps of: placing a plurality of main flip-flops used for realizing the predetermined function; placing a plurality of spare flip-flops; and placing a clock adjustment circuit operable to generate a clock signal which is adjusted for synchronizing the plurality of main flip-flops and the plurality of spare flip-flops, and supply the adjusted clock signal to the plurality of main flip-flops and the plurality of spare flip-flops.

Here, the manufacturing method may further include the step of placing a scan path wire and a scan control signal wire, the scan path wire connecting the plurality of main flip-flops and the plurality of spare flip-flops in series, and the scan control signal wire being connected to each of the plurality of main flip-flops and each of the plurality of spare flip-flops.

It should be obvious that in the case where the data output terminal of a spare flip-flop is connected to the scan input terminal of another flip-flop, a buffer circuit and/or an inverter circuit may be interposed therebetween.

According to these manufacturing methods, there is no need to readjust the clock signal in a semiconductor integrated circuit, with it being possible to reduce the design time.

BRIEF DESCRIPTION OF THE DRAWINGS

These and other objects, advantages and features of the invention will become apparent from the following description thereof taken in conjunction with the accompanying drawings which illustrate a specific embodiment of the invention.

In the drawings.

DESCRIPTION OF THE PREFERRED EMBODIMENTS

1. First Embodiment

The following describes a semiconductor integrated circuit 10 (not illustrated) according to a first embodiment of the present invention. To achieve a desired function, the semiconductor integrated circuit 10 is formed by a plurality of layers including at least one cell placement layers where a plurality of standard cells (such as flip-flops and inverters) are placed, and at least one metal wiring layer. Each cell is connected to another cell and the like, via a signal line formed in the metal wiring layer. The semiconductor integrated circuit 10 is roughly made up of a plurality of functional blocks including a functional block 101.

The following describes the functional block 101 in the semiconductor integrated circuit 10.

1.1. Construction of the Functional Block 101

Figure 1:
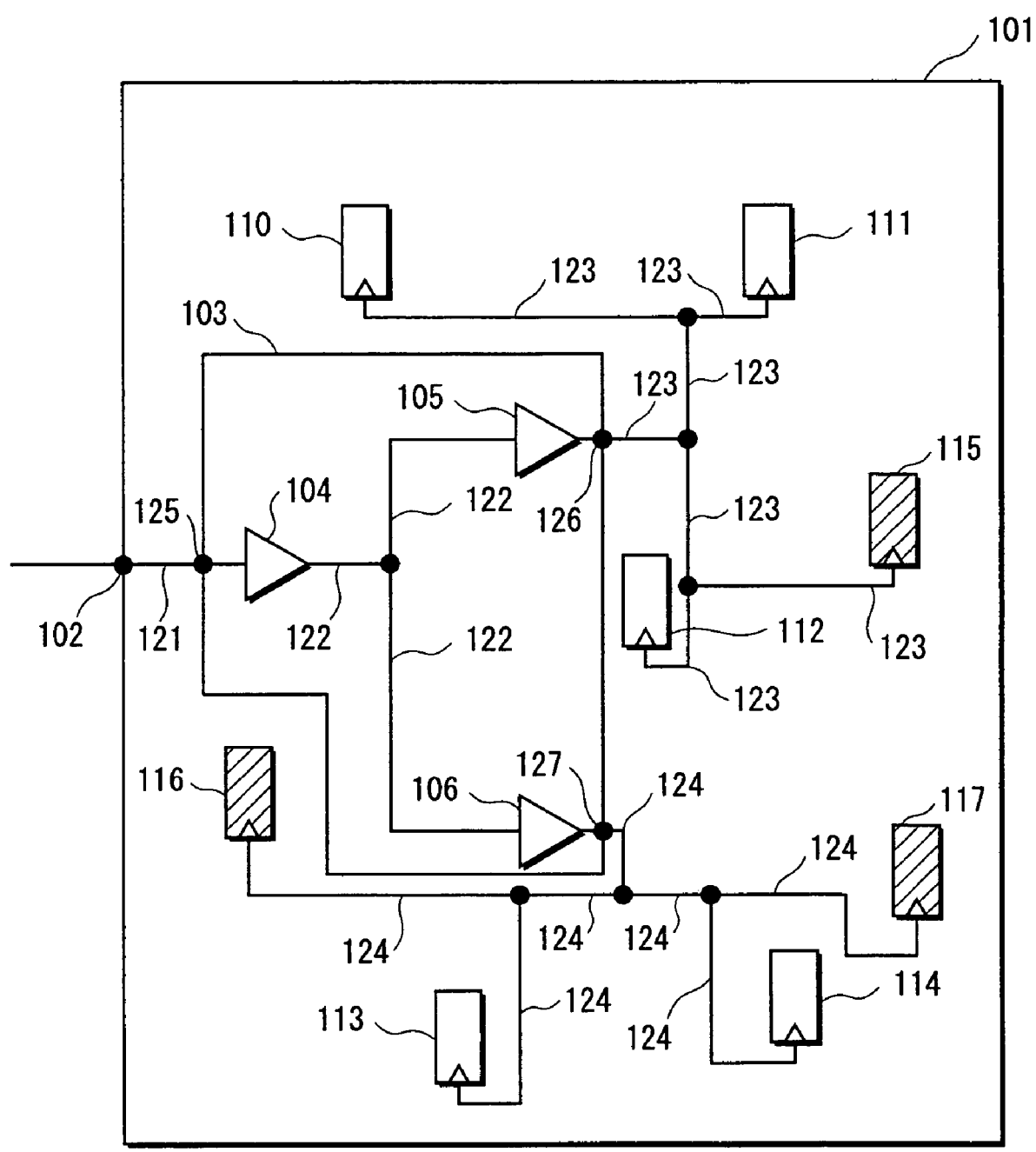
FIG. 1 is a simplified layout diagram mainly showing a clock-based construction of a functional block in a semiconductor integrated circuit of a first embodiment of the present invention.

FIG. 1 is a simplified layout diagram mainly showing a clock-based construction of the functional block 101. Regarding the clock-based construction, the functional block 101 includes a clock input terminal 102, a signal line 121, a clock tree synthesis (CTS) circuit 103, signal lines 123 and 124, main flip-flops 110 to 114, and spare flip-flops 115 to 117, as shown in FIG. 1.

Figure 2:
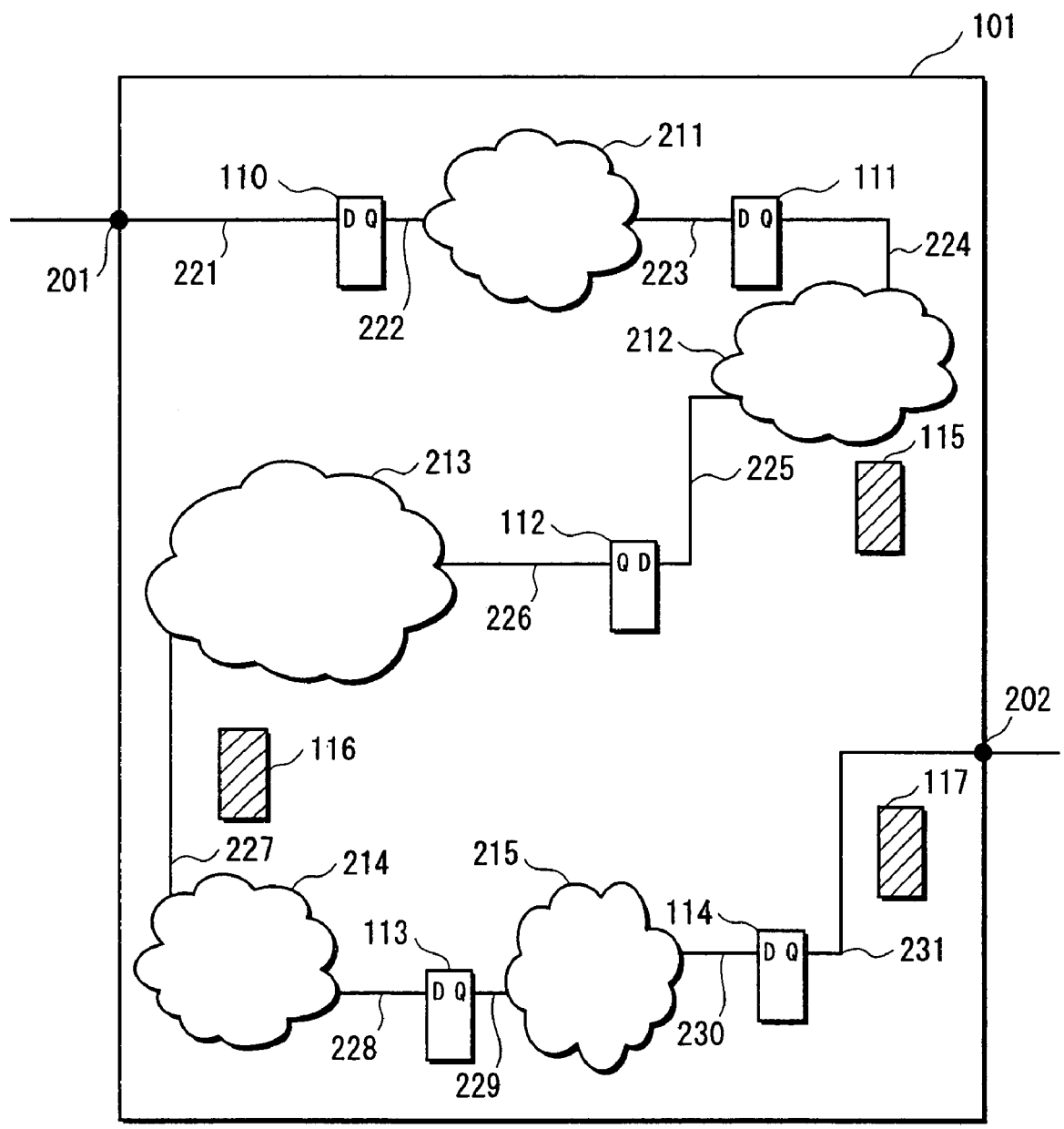
FIG. 2 is a simplified layout diagram mainly showing a main and spare function-based construction of the functional block in the semiconductor integrated circuit of the first embodiment.

FIG. 2 is a simplified layout diagram mainly showing a main and spare function-based construction of the functional block 101, that is, a construction of the functional block 101 relating to its original function and spare function. Regarding the main and spare function-based construction, the functional block 101 includes an input terminal 201, the main flip-flops 110 to 114, the spare flip-flops 115 to 117, cell groups 211 to 215 which are each composed of one or more cells, signal lines 221 to 231, and an output terminal 202, as shown in FIG. 2.

The functional block 101 receives a clock signal from outside at the clock input terminal 102. The functional block 101 also receives a signal from outside at the input terminal 201, and outputs a signal generated from the received signal to outside at the output terminal 202.

(1) Construction of the CTS Circuit 103

The CTS circuit 103 is formed by connecting clock buffers in a tree form, for distributing the clock signal. As shown in FIG. 1, the CTS circuit 103 includes an input terminal 125, clock buffers 104 to 106, a signal line 122, and output terminals 126 and 127. The input terminal 125 is connected to an input terminal of the clock buffer 104, and an output terminal of the clock buffer 104 is connected to the signal line 122. The signal line 122 is connected to input terminals of the clock buffers 105 and 106, and output terminals of the clock buffers 105 and 106 are connected respectively to the output terminals 126 and 127.

Thus, the clock buffers 104 to 106 form a clock tree structure of two levels, i.e. two stages, where the clock buffer 104 is a root and the clock buffers 105 and 106 are leaves.

Driving capacities of the clock buffers 104 to 106 and a wire length of the signal line 122 are adjusted so that the clock signal is supplied to the main flip-flops 110 to 114 and the spare flip-flops 115 to 117 within a predetermined amount of clock skew.

With this construction, the CTS circuit 103 adjusts the clock signal received from outside via the clock input terminal 102, and outputs the adjusted clock signal to outside from the output terminals 126 and 127.

(2) Constructions of the Main Flip-Flops 110 to 114 and the Spare Flip-Flops 115 to 117

The main flip-flops 110 to 114 and the spare flip-flops 115 to 117 are each a D-type flip-flop having a scan capability. Each flip-flop has a data input terminal D, a scan input terminal SI, a scan enable terminal SE, a data output terminal Q, an inverted data output terminal NQ, a clock input terminal CK, and the like, for external connection. Since a D-type flip-flop having a scan capability is well known in the art, its explanation has been omitted here.

Figure 3:
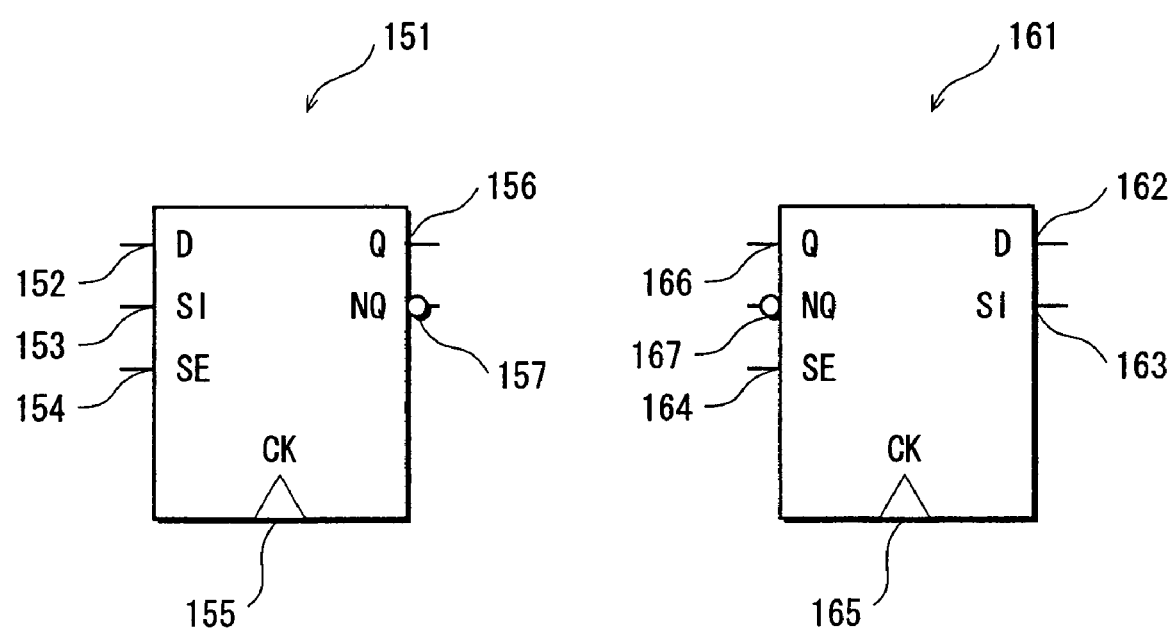
FIG. 3 shows example representations of flip-flops.

FIG. 3 shows example representations of these flip-flops, to clarify a connection relationship of each flip-flop with other cells in the drawings referred to in this specification. In FIG. 3, a flip-flop 151 has a data input terminal 152, a scan input terminal 153, a scan enable terminal 154, a data output terminal 156, an inverted data output terminal 157, and a clock input terminal 155. A flip-flop 161 has a data input terminal 162, a scan input terminal 163, a scan enable terminal 164, a data output terminal 166, an inverted data output terminal 167, and a clock input terminal 165.

In both the flip-flops 151 and 161, the signs "D", "SI", "SE", "Q", "NQ", and "CK" with a triangle figure respectively indicate the data input terminal D, the scan input terminal SI, the scan enable terminal SE, the data output terminal Q, the inverted data output terminal NQ, and the clock input terminal CK.

It should be noted here that the flip-flops 151 and 161 are identical flip-flops. They are merely represented in different manners, with the data input terminal D and the scan input terminal SI being interchanged respectively with the data output terminal Q and the inverted data output terminal NQ.

The main flip-flops 110 to 114 are used for achieving the original function of the functional block 101.

The spare flip-flops 115 to 117 are reserve flip-flops which are in a wait state, and are provided as flip-flops for functional changes. The spare flip-flops 115 to 117 are placed in the functional block 101 together with the main flip-flops 110 to 114 in areas where a correction is likely to be needed (e.g. areas where a lot of flip-flops are present), so that when a defect is found in the semiconductor integrated circuit 10, the defect can be corrected by changing only the metal wiring layer. The data input terminals D of the spare flip-flops 115 to 117 are each set to have an input of the logical value "0", so that the spare flip-flops 115 to 117 do not contribute to the original function of the functional block 101. Also, the data output terminals Q and the inverted data output terminals NQ of the spare flip-flops 115 to 117 are not connected to anything, that is, the spare flip-flops 115 to 117 are open and floating.

(3) Connection Relationship of Each Cell

The clock input terminal 102 is connected to the input terminal 125 of the CTS circuit 103 via the signal line 121. The output terminal 126 of the CTS circuit 103 is connected to the clock input terminals CK of the main flip-flops 110, 111, and 112 and the spare flip-flop 115 via the signal line 123. The output terminal 127 of the CTS circuit 103 is connected to the clock input terminals CK of the main flip-flops 113 and 114 and the spare flip-flops 116 and 117 via the signal line 124.

The input terminal 201 is connected to the data input terminal D of the main flip-flop 110 via the signal line 221. The data output terminal Q of the main flip-flop 110 is connected to the data input terminal D of the main flip-flop 111 via the signal line 222, the cell group 211, and the signal line 223. The data output terminal Q of the main flip-flop 111 is connected to the data input terminal D of the main flip-flop 112 via the signal line 224, the cell group 212, and the signal line 225. The data output terminal Q of the main flip-flop 112 is connected to the data input terminal D of the main flip-flop 113 via the signal line 226, the cell group 213, the signal line 227, the cell group 214, and the signal line 228. The data output terminal Q of the main flip-flop 113 is connected to the data input terminal D of the main flip-flop 114 via the signal line 229, the cell group 215, and the signal line 230. The data output terminal Q of the main flip-flop 114 is connected to the output terminal 202 via the signal line 231.

1.2. Construction of the Semiconductor Integrated Circuit after Changing the Metal Wiring Layer If a defect is found when using the semiconductor integrate circuit 10 having the above construction, the design of the metal wiring layer is changed to connect the data input terminal D, the data output terminal Q, and the inverted data output terminal NQ of any of the spare flip-flops 115 to 117 with other cells and the like, in order to eliminate the defect.

In a semiconductor integrated circuit 10a (not illustrated) fabricated after changing the design of the metal wiring layer, any of the spare flip-flops 115 to 117 is connected to other cells and the like through the metal wiring layer, and operates together with the main flip-flops 110 to 114 in sync with the clock signal output from the CTS circuit 103.

The following describes a functional block 101a in the semiconductor integrated circuit 10a, which corresponds to the functional block 101 in the semiconductor integrated circuit 10.

The design of the metal wiring layer is changed as follows. The signal line 231 which connects the data output terminal Q of the main flip-flop 114 and the output terminal 202 shown in FIG. 2 is removed. Instead, a signal line 232 which connects the data output terminal Q of the main flip-flop 114 and the data input terminal D of the spare flip-flop 117 and a signal line 233 which connects the data output terminal Q of the spare flip-flop 117 and the output terminal 202 are formed in the metal wiring layer.

Figure 4:
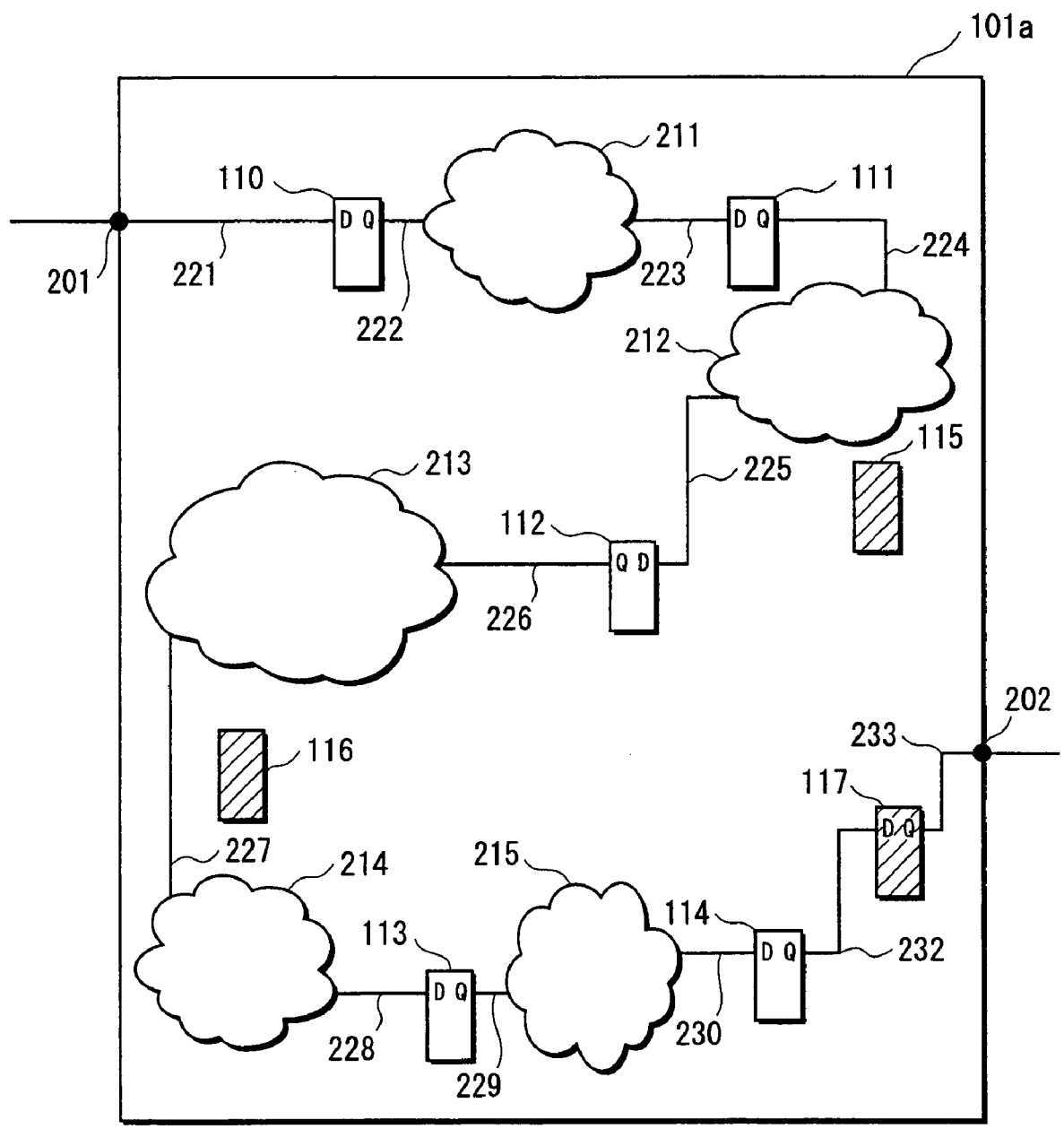
FIG. 4 is a simplified layout diagram mainly showing a main and spare function-based construction of a functional block in a semiconductor integrated circuit fabricated after changing a design of a metal wiring layer in the semiconductor integrated circuit of the first embodiment.

As a result, the data output terminal Q of the main flip-flop 114 is connected to the data input terminal D of the spare flip-flop 117 via the signal line 232 and the data output terminal Q of the spare flip-flop 117 is connected to the output terminal 202 via the signal line 232 in the functional block 101a, as shown in FIG. 4.

Note here that the other parts of the functional block 101a are the same as those of the functional block 101 shown in FIG. 2.

1.3. Conclusion on the First Embodiment

As described above, the clock signal received at the clock input terminal 102 is adjusted in the CTS circuit 103, and supplied to each of the main flip-flops 110 to 114 and the spare flip-flops 115 to 117.

Thus, the clock signal adjusted by the CTS circuit 103 is fed to the spare flip-flops 115 to 117 as well as the main flip-flops 110 to 114, in advance. Accordingly, when it becomes necessary to modify the operation of the functional block 101 by changing a mask of the metal wiring layer so as to use any of the spare flip-flops 115 to 117, there is no need to adjust the clock signal. Also, with regard to a clock signal supply route, the mask of the metal wiring layer need not be changed. Therefore, the clock signal supplied to the main flip-flops 110 to 114 and the spare flip-flops 115 to 117 is kept from being affected by a change to the mask of the metal wiring layer with regard to the clock signal.

Also, from an initial design stage the semiconductor integrated circuit 10 can be designed with clock signal lines to the spare flip-flops 115 to 117 being taken into account for synchronization and crosstalk prevention. This makes it easier to later change the design 1.4. Modification to the First Embodiment The following describes a functional block 101b in a semiconductor integrated circuit 10b (not illustrated) that is a modification to the first embodiment. The functional block 101b has the same construction as the functional block 101, and further has a function of performing a scan path test on the main flip-flops 110 to 114 and the spare flip-flops 115 to 117.

Figure 5:
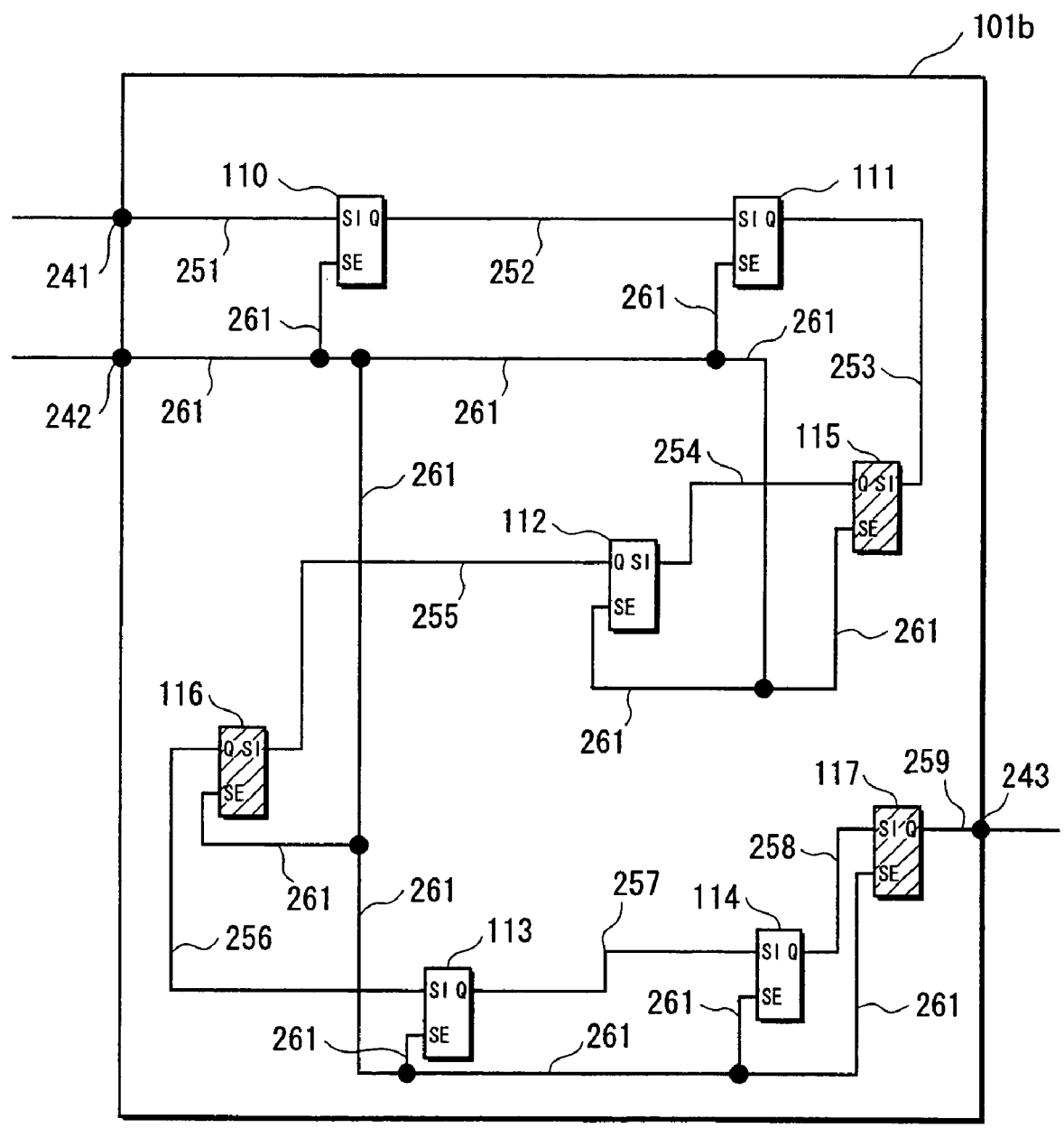
FIG. 5 is a simplified layout diagram mainly showing a scan-based construction of a functional block in a semiconductor integrated circuit which is a modification to the first embodiment.

FIG. 5 is a simplified layout diagram mainly showing a scan-based construction of the functional block 101b. In addition to the same construction as the functional block 101, the functional block 101b further includes a scan data input terminal 241, a scan enable signal input terminal 242, signal lines 251 to 259, a signal line 261, and a scan data output terminal 243. In FIG. 5, construction elements which are the same as those in FIG. 1 have been given the same reference numerals, and their explanation has been omitted.

Here, the signal lines 251 to 259 are scan path wires, and the signal line 261 is a scan control signal wire.

The scan data input terminal 241 is connected to the scan input terminal SI of the main flip-flop 110 via the signal line 251. The data output terminal Q of the main flip-flop 110 is connected to the scan input terminal SI of the main flip-flop 111 via the signal line 252. The data output terminal Q of the main flip-flop 111 is connected to the scan input terminal SI of the spare flip-flop 115 via the signal line 253. The data output terminal Q of the spare flip-flop 115 is connected to the scan input terminal SI of the main flip-flop 112 via the signal line 254. The data output terminal Q of the main flip-flop 112 is connected to the scan input terminal SI of the spare flip-flop 116 via the signal line 255. The data output terminal Q of the spare flip-flop 116 is connected to the scan input terminal SI of the main flip-flop 113 via the signal line 256. The data output terminal Q of the main flip-flop 113 is connected to the scan input terminal SI of the main flip-flop 114 via the signal line 257. The data output terminal Q of the main flip-flop 114 is connected to the scan input terminal SI of the spare flip-flop 117 via the signal line 258. The data output terminal Q of the spare flip-flop 117 is connected to the scan data output terminal 243 via the signal line 259.

The scan enable signal input terminal 242 is connected to the signal line 261, which is connected to each of the scan enable terminals SE of the main flip-flops 110 to 114 and the spare flip-flops 115 to 117.

The functional block 101*b* receives scan data from outside at the scan data input terminal 241. The received scan data is output to outside, via the signal line 251, the main flip-flop 110, the signal line 252, the main flip-flop 111, the signal line 253, the spare flip-flop 115, the signal line 254, the main flip-flop 112, the signal line 255, the spare flip-flop 116, the signal line 256, the main flip-flop 113, the signal line 257, the main flip-flop 114, the signal line 258, the spare flip-flop 117, the signal line 259, and the scan data output terminal 243.

The functional block 101*b* also receives a scan enable signal from outside at the scan enable signal input terminal 242. The received scan enable signal is fed to each of the scan enable terminals SE of the main flip-flops 110 to 114 and the spare flip-flops 115 to 117, via the signal line 261. The scan enable signal takes one of the logical values "1" and "0". The logical value "1" instructs to perform a scan shift operation. The logical value "0" instructs to perform a normal operation.

Accordingly, when the scan enable signal input in the scan enable signal input terminal 242 is "1", the main flip-flops 110 to 114 and the spare flip-flops 115 to 117 each perform a scan shift operation. When the scan enable signal input in the scan enable signal input terminal 242 is "0", the main flip-flops 110 to 114 and the spare flip-flops 115 to 117 each perform a normal operation.

Conclusion on the Modification

As described above, when the functional block 101*b* receives the scan enable signal which is "1" at the scan enable signal input terminal 242, all of the main flip-flops 110 to 114 and the spare flip-flops 115 to 117 enter into a scan shift operation mode. As a result, the scan data signal input in the scan data input terminal 241 travels through a scan path formed by connecting in series the main flip-flop 110, the main flip-flop 111, the spare flip-flop 115, the main flip-flop 112, the spare flip-flop 116, the main flip-flop 113, the main flip-flop 114, and the spare flip-flop 117, and is output from the scan data output terminal 243 to outside.

Even when it becomes necessary to modify the operation of the functional block 101*b* by changing the mask of the metal wiring layer so as to use any of the spare flip-flops 115 to 117, the spare flip-flops 115 to 117 have already been designed to receive the scan enable signal, and also a scan data chain has already been established. Hence there is no need to change the mask of the metal wiring layer with regard to scan.

1.5. Design Procedure 1

Figure 6:
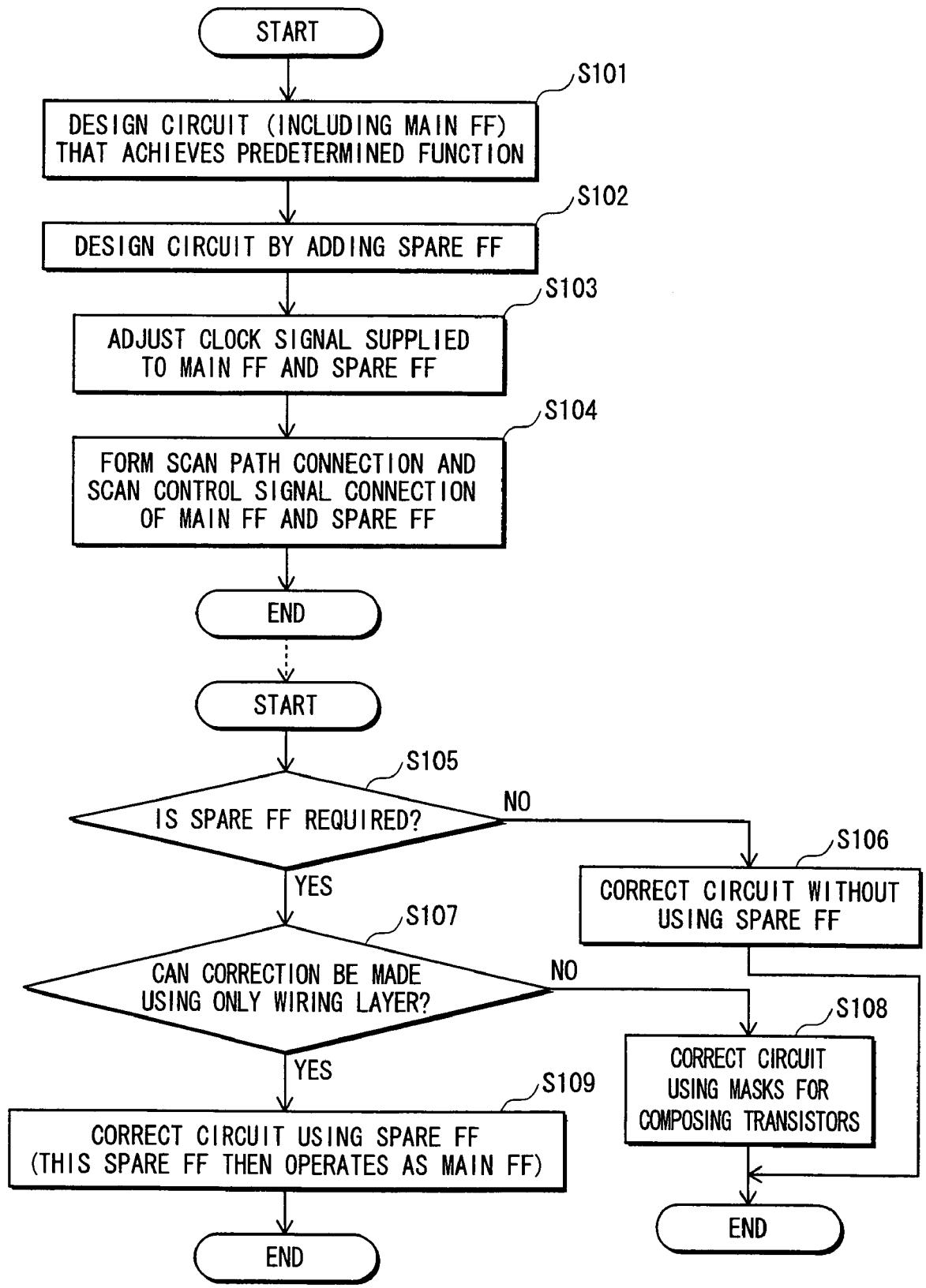
FIG. 6 is a flowchart showing a design procedure of the semiconductor integrated circuit which is the modification to the first embodiment.

A design procedure of the semiconductor integrated circuit 10*b* which is the modification to the first embodiment is described below, with reference to a flowchart shown in FIG. 6.

First, a circuit design for realizing the predetermined function is performed. In detail, a layout design of placing standard cells such as main flip-flops, ANDs, and NORs are performed (S101).

Next, a layout design of additionally placing standard cells such as spare flip-flops, ANDs, and NORs in areas not occupied by the main standard cells placed in step S101 is performed (S102).

After this, the clock signal is adjusted for synchronizing the main flip-flops and the spare flip-flops, by modifying the layout of standard cells and wires (S103).

Further, signal lines for scan path connection and scan control signal connection of the main flip-flops and the spare flip-flops are laid out (S104).

As a result, a layout design in which the main flip-flops and the spare flip-flops are placed is completed. The semiconductor integrated circuit 10*b* is fabricated based on this design.

When a defect is found in a test or the like of the fabricated semiconductor integrated circuit 10*b*, a correction is made in the following manner.

A judgment is made on whether the correction requires any of the spare flip-flops (S105). If the judgment is negative (S105: NO), the correction is made without using any of the spare flip-flops (S106).

If the correction requires any of the spare flip-flops (S105: YES), a judgment is made on whether the correction can be made by changing only the metal wiring layer (S107). If the judgment is negative (S107: NO), the correction is made involving masks for composing transistors, by changing a diffusion layer (cell placement layer) by addition of a transistor or the like (S108).

If the correction can be made by changing only the metal wiring layer (S107: YES), the correction is made by connecting any of the spare standard cells with a wire in the metal wiring layer (S109). The connected spare flip-flop then operates as a main flip-flop.

1.6. Design Procedure 2

Figure 7:
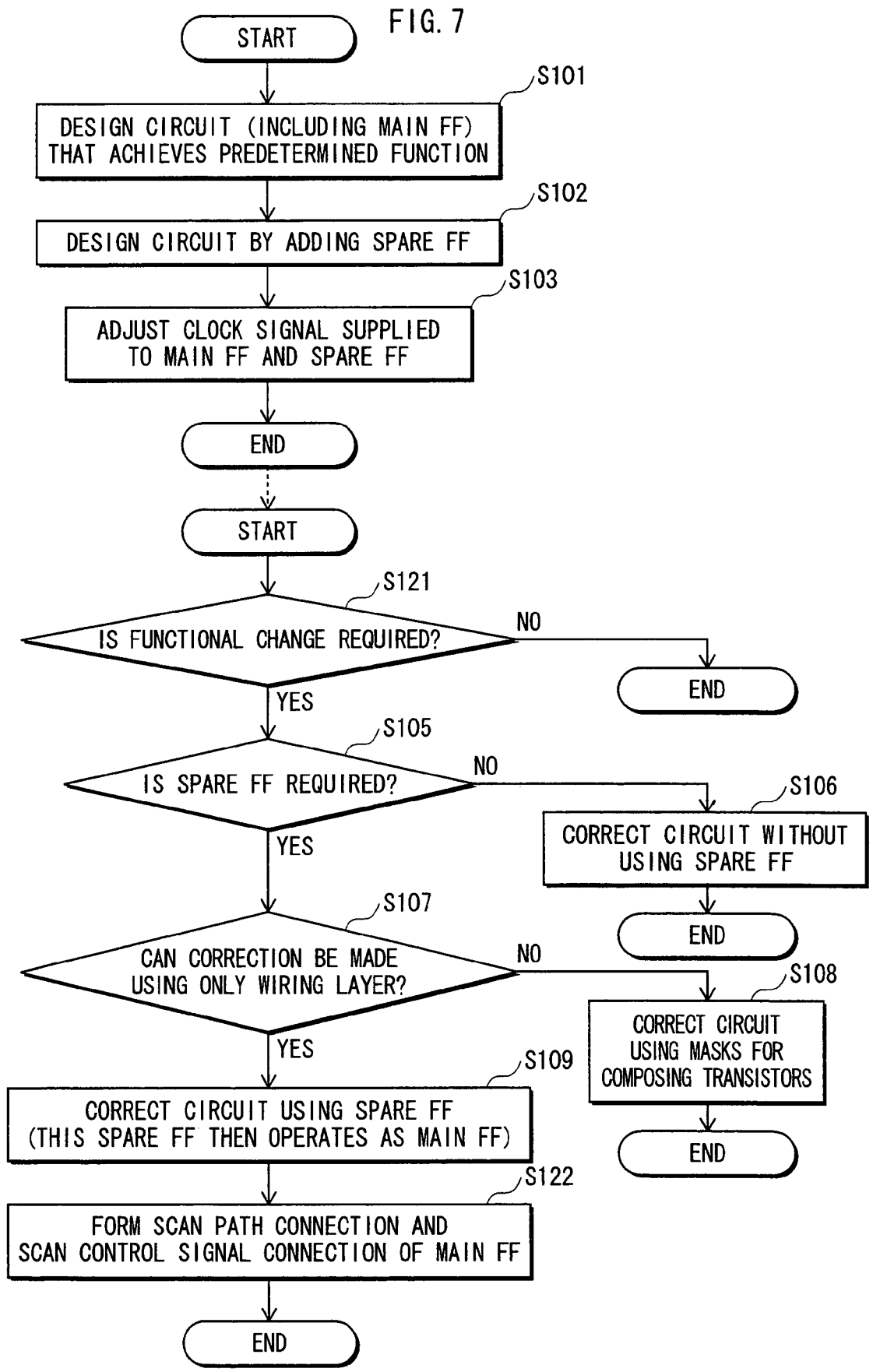
FIG. 7 is a flowchart showing a design procedure of the semiconductor integrated circuit of the first embodiment.

A design procedure of the semiconductor integrated circuit 10 of the first embodiment is described below, with reference to a flowchart shown in FIG. 7.

First, a circuit design for realizing the predetermined function is performed. In detail, a layout design of placing standard cells such as main flip-flops, ANDS, and NORs is performed (S101).

Next, a layout design of additionally placing standard cells, such as spare flip-flops, ANDs, and NORs, in areas not occupied by the main standard cells placed in step S101 is performed (S102).

After this, the clock signal is adjusted for synchronizing the main flip-flops and the spare flip-flops, by modifying the layout of standard cells and wires (S103).

As a result, a layout design in which the main flip-flops and the spare flip-flops are placed is completed. The semiconductor integrated circuit 10 is fabricated based on this design.

When a defect is found in a test or the like of the fabricated semiconductor integrated circuit 10 (S121: YES), a judgment is made on whether a correction requires any of the spare flip-flops (S105). If the judgment is negative (S105: NO), the correction is made without using any of the spare flip-flops (S106).

If the correction requires any of the spare flip-flops (S105: YES), a judgment is made on whether the correction can be made by changing only the metal wiring layer (S107). If the judgment is negative (S107: NO), the correction is made involving the masks for composing transistors, by changing the diffusion layer by addition of a transistor or the like (S108).

If the correction can be made by changing only the metal wiring layer (S107: YES), the correction is made by connecting any of the spare standard cells with a wire in the metal wiring layer (S109). The connected spare flip-flop then serves as a main flip-flop. After this, signal lines for scan path connection and scan control signal connection of the main flip-flops are laid out (S122).

1.7. Conclusion on the First Embodiment and its Modification

According to the first embodiment and its modification, even when it becomes necessary to modify the operation of the functional block 101 or 101b by changing the metal wiring layer so as to use any of the spare flip-flops 115 to 117, there is no need to change the metal wiring layer with regard to the clock signal, the scan data signal, and the scan enable signal.

When compared with the conventional technique that requires changes to the metal wiring layer with regard to these signals, the occurrence of a new problem such as crosstalk in signal lines caused by such changes can be prevented. Also, there is no need to readjust the clock signal supplied to the main flip-flops. This represents a significant saving in design time for changing the metal wiring layer.

2. Second Embodiment

The following describes a semiconductor integrated circuit 30 (not illustrated) according to a second embodiment of the present invention. To achieve a desired function, the semiconductor integrated circuit 30 is formed by a plurality of layers including at least one cell placement layer where a plurality of standard cells (such as flip-flops and inverters) are placed, and at least one metal wiring layer. Each cell is connected to another cell and the like, via a signal line formed in the metal wiring layer. The semiconductor integrated circuit 30 is roughly made up of a plurality of functional blocks including functional blocks 301 and 411.

2.1. Construction of the Functional Block 411

Figure 8:
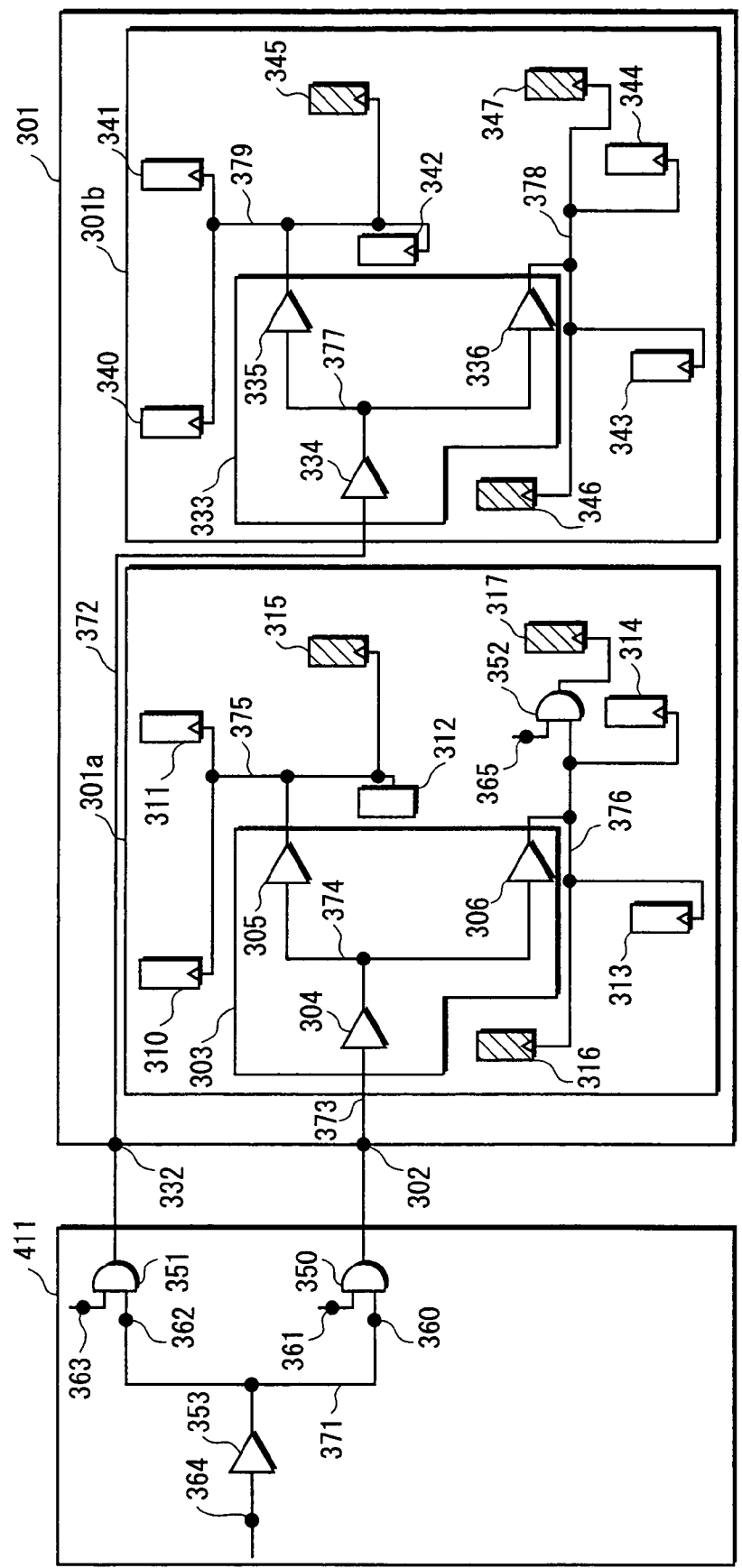
FIG. 8 is a simplified layout diagram mainly showing clock-based constructions of functional blocks in a semiconductor integrated circuit of a second embodiment of the present invention.

FIG. 8 is a simplified layout diagram mainly showing a construction of the functional block 411 and a clock-based construction of the functional block 301. As shown in the drawing, the functional block 411 includes an input terminal 364, a clock buffer 353, a signal line 371, clock gating circuits 350 and 351, and other circuits (not illustrated).

The input terminal 364, the clock buffer 353, the signal line 371, and the clock gating circuits 350 and 351 constitute a clock supply control circuit.

The input terminal 364 is connected to an input terminal of the clock buffer 353 via a signal line. An output terminal of the clock buffer 353 is connected to a clock terminal 360 of the clock gating circuit 350 and a clock terminal 362 of the clock gating circuit 351, via the signal line 371. Output terminals of the clock gating circuits 350 and 351 are connected respectively to clock input terminals 302 and 332 of the functional block 301.

The clock gating circuit 350 gates (enables or disables) a clock signal received at the clock terminal 360, in accordance with an enable signal received at an enable signal input terminal 361. The clock gating circuit 350 outputs the gated clock signal to the clock input terminal 302 of the functional block 301. The gated clock signal referred to here is a clock signal a supply of which is controlled.

The enable signal received at the enable signal input terminal 361 takes one of logical values "0" and "1". If the enable signal is "0", the clock gating circuit 350 disables the clock signal. If the enable signal is "1", the clock gating circuit 350 enables the clock signal.

The enable signal received at the enable signal input terminal 361 is "0" in a predetermined period, and "1" in another predetermined period. These two periods alternate each other.

The clock gating circuit 351 gates the clock signal received at the clock terminal 362, in accordance with an enable signal received at an enable signal input terminal 363. The clock gating circuit 351 outputs the gated clock signal to the clock input terminal 332 of the functional block 301.

The enable signal received at the enable signal input terminal 363 takes one of the logical values "0" and "1". If the enable signal is "0", the clock gating circuit 351 disables the clock signal. If the enable signal is "1", the clock gating circuit 351 enables the clock signal.

The enable signal received at the enable signal input terminal 363 is "0" in a predetermined period, and "1" in another predetermined period. These two periods alternate each other.

2.2. Construction of the Functional Block 301

Figure 9:
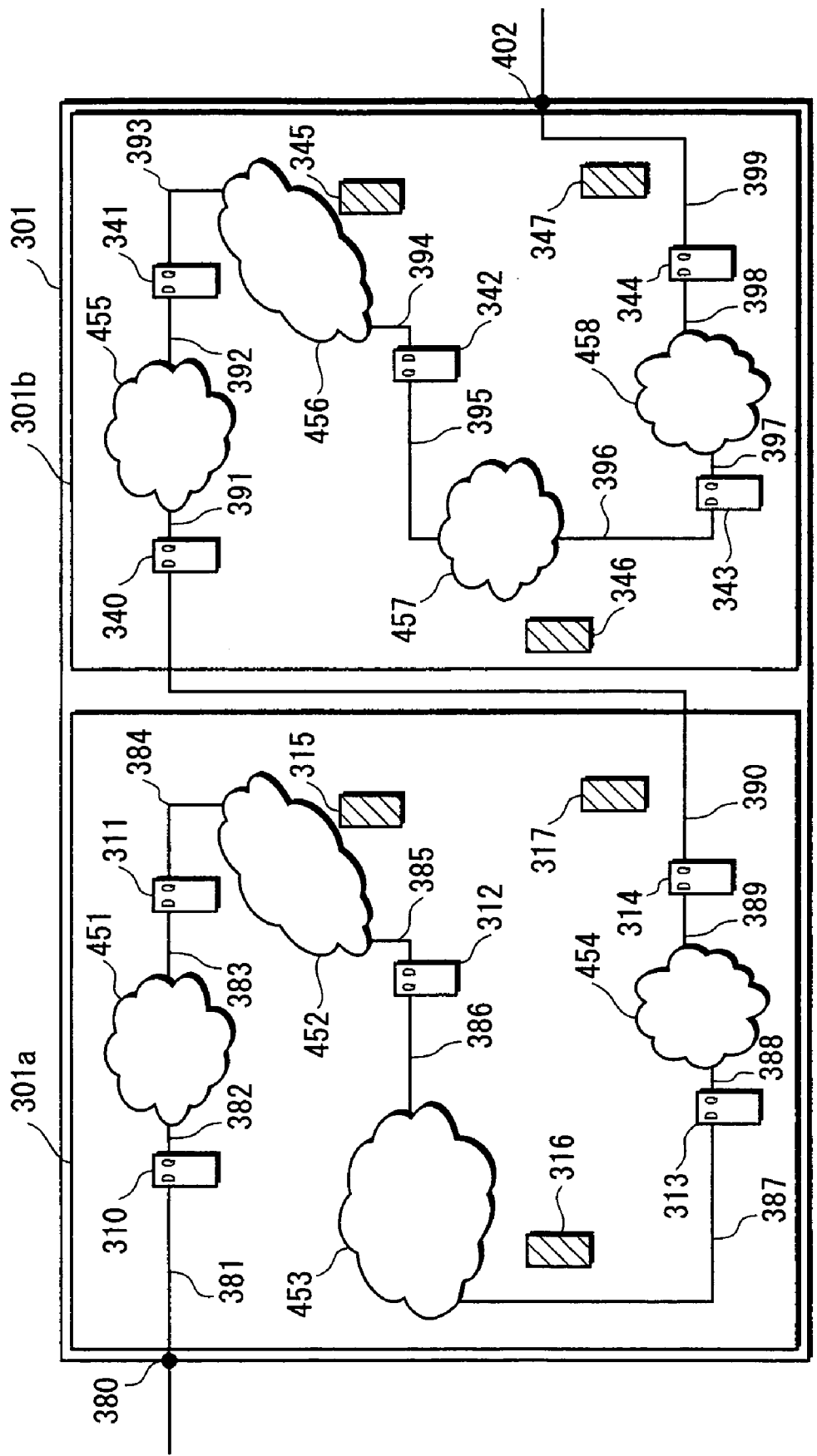
FIG. 9 is a simplified layout diagram mainly showing a main and spare function-based construction of one of the functional blocks in the semiconductor integrated circuit of the second embodiment.

FIG. 9 is a simplified layout diagram mainly showing a main and spare function-based construction of the functional block 301. As shown in FIGS. 8 and 9, the functional block 301 includes the clock input terminals 302 and 332, an input terminal 380, subblocks 301a and 301b, and an output terminal 402.

2.2.1. Subblock 301a

Regarding the clock-based construction, the subblock 301a includes a signal line 373, a CTS circuit 303, signal lines 375 and 376, a clock gating circuit 352, main flip-flops 310 to 314, and spare flip-flops 315 to 317, as shown in FIG. 8.

Regarding the main and spare function-based construction, the subblock 301a includes the main flip-flops 310 to 314, the spare flip-flops 315 to 317, cell groups 451 to 454 which are each made up of one or more cells, and signal lines 381 to 390, as shown in FIG. 9.

The subblock 301a receives the gated clock signal via the clock input terminal 302, and operates according to the gated clock signal. The subblock 301a also receives a signal from outside via the input terminal 380, and outputs a signal generated from the received signal to the subblock 301b from the signal line 390.

The subblock 301a operates when the gated clock signal is supplied via the clock input terminal 302, and does not operate when the gated clock signal is not supplied.

(1) CTS Circuit 303

The CTS circuit 303 adjusts the clock signal for synchronizing the main flip-flops 310 to 314 and the spare flip-flops 315 to 317 in the subblock 301a, by adjusting driving capacities of clock buffers and wire lengths. Which is to say, the subblock 301a for realizing part of the function of the functional block 301 is subjected to the timing adjustment by the CTS circuit 303.

The CTS circuit 303 is formed by connecting clock buffers in a tree form so as to distribute a clock signal, in the same way as the CTS circuit 103. As shown in FIG. 8, the CTS circuit 303 includes clock buffers 304 to 306 and a signal line 374, and has one input terminal and two output terminals. The clock input terminal 302 is connected to an input terminal of the clock buffer 304, and an output terminal of the clock buffer 304 is connected to the signal line 374. The signal line 374 is connected to input terminals of the clock buffers 305 and 306, and output terminals of the clock buffers 305 and 306 are connected respectively to the signal lines 375 and 376.

Thus, the clock buffers 304 to 306 form a clock tree structure in which the clock buffer 304 is a root and the clock buffers 305 and 306 are leaves.

The driving capacities of the clock buffers 304 to 306 and the wire length of the signal line 374 are adjusted such that the clock signal is supplied to the main flip-flops 310 to 314 and the spare flip-flops 315 to 317 in the subblock 301a within a predetermined amount of clock skew.

With the above construction, the CTS circuit 303 adjusts the clock signal received from the functional block 411 via the clock input terminal 302, and outputs the adjusted clock signal to the main flip-flops 310 to 314 and the spare flip-flops 315 to 317 via the signal lines 375 and 376.

(2) Main Flip-Flops 310 to 314 and Spare Flip-Flops 315 to 317

The main flip-flops 310 to 314 and the spare flip-flops 315 to 317 are each a D-type flip-flop having a scan capability. Each flip-flop has the data input terminal D, the scan input terminal SI, the scan enable terminal SE, the data output terminal Q, the inverted data output terminal NQ, the clock input terminal CK, and the like, for external connection.

The main flip-flops 310 to 314 are used for realizing the original function of the subblock 301a.

The spare flip-flops 315 to 317 are placed in the subblock 301a together with the main flip-flops 310 to 314 in areas where a correction is likely to be needed (e.g. areas where a lot of flip-flops are present), so that when a defect is found in the semiconductor integrated circuit 30, a correction can be made by changing only the metal wiring layer. The data input terminals D of the spare flip-flops 315 to 317 are each set to have an input of the logical value "0", so that the spare flip-flops 315 to 317 do not contribute to the original function of the subblock 301a. Also, the data output terminals Q and the inverted data output terminals NQ of the spare flip-flops 315 to 317 are not connected to anything, that is, the spare flip-flops 315 to 317 are open and floating.

(3) Clock Gating Circuit 352

The clock gating circuit 352 gates (enables or disables) the clock signal received at its clock input terminal from the signal line 376, in accordance with an enable signal received at an enable signal input terminal 365. The clock gating circuit 352 outputs the gated clock signal to the clock input terminal CK of the spare flip-flop 317.

The enable signal received at the enable signal input terminal 365 constantly instructs to disable the clock signal.

(4) Connection Relationship of Each Cell

The clock input terminal 302 is connected to the input terminal of the CTS circuit 303 via the signal line 373. One output terminal of the CTS circuit 303 is connected to the clock input terminals CK of the main flip-flops 310, 311, and 312 and the spare flip-flop 315, via the signal line 375. The other output terminal of the CTS circuit 303 is connected to the clock input terminals CK of the main flip-flops 313 and 314 and the spare flip-flop 316 and the clock input terminal of the clock gating circuit 352, via the signal line 376. The clock output terminal of the clock gating circuit 352 is connected to the clock input terminal CK of the spare flip-flop 317.

The input terminal 380 is connected to the data input terminal D of the main flip-flop 310 via the signal line 381. The data output terminal Q of the main flip-flop 310 is connected to the data input terminal D of the main flip-flop 311 via the signal line 382, the cell group 451, and the signal line 383. The data output terminal Q of the main flip-flop 311 is connected to the data input terminal D of the main flip-flop 312 via the signal line 384, the cell group 452, and the signal line 385. The data output terminal Q of the main flip-flop 312 is connected to the data input terminal D of the main flip-flop 313 via the signal line 386, the cell group 453, and the signal line 387. The data output terminal Q of the main flip-flop 313 is connected to the data input terminal D of the main flip-flop 314 via the signal line 388, the cell group 454, and the signal line 389. The data output terminal Q of the main flip-flop 314 is connected to the subblock 301b via the signal line 390.

2.2.2. Subblock 301b

Regarding the clock-based construction, the subblock 301b includes a signal line 372, a CTS circuit 333, signal lines 378 and 379, main flip-flops 340 to 344, and spare flip-flops 345 to 347, as shown in FIG. 8.

Regarding the main and spare function-based construction, the subblock 301b includes the main flip-flops 340 to 344, the spare flip-flops 345 to 347, cell groups 455 to 458 which are each made up of one or more cells, and signal lines 390 to 399, as shown in FIG. 9.

The subblock 301b receives the gated clock signal via the clock input terminal 332, and operates according to the gated clock signal. The subblock 301b also receives a signal from the subblock 301a via the signal line 390, and outputs a signal generated from the received signal to outside from the signal line 399 and the output terminal 402.

The subblock 301b operates when the gated clock signal is supplied via the clock input terminal 332, and does not operate when the gated clock signal is not supplied.

(1) CTS Circuit 333

The CTS circuit 333 adjusts the clock signal for synchronizing the main flip-flops 340 to 344 and the spare flip-flops 345 to 347 in the subblock 301b, by adjusting driving capacities of clock buffers and wire lengths. Which is to say, the subblock 301b that realizes part of the function of the functional block 301 is subjected to the timing adjustment by the CTS circuit 333.

The CTS circuit 333 is formed by connecting clock buffers in a tree form so as to distribute a clock signal, in the same way as the CTS circuit 103. As shown in FIG. 8, the CTS circuit 333 includes clock buffers 334 to 336 and a signal line 377, and has one input terminal and two output terminals. The clock input terminal 332 is connected to an input terminal of the clock buffer 334, and an output terminal of the clock buffer 334 is connected to the signal line 377. The signal line 377 is connected to input terminals of the clock buffers 335 and 336, and output terminals of the clock buffers 335 and 336 are connected respectively to the signal lines 379 and 378.

Thus, the clock buffers 334 to 336 form a clock tree structure in which the clock buffer 334 is a root and the clock buffers 335 and 336 are leaves.

The driving capacities of the clock buffers 334 to 336 and the wire length of the signal line 377 are adjusted so that the clock signal is supplied to the main flip-flops 340 to 344 and the spare flip-flops 345 to 347 in the subblock 301b within a predetermined amount of clock skew.

With the above construction, the CTS circuit 333 adjusts the clock signal received from the functional block 411 via the clock input terminal 332, and outputs the adjusted clock signal to the main flip-flops 340 to 344 and the spare flip-flops 345 to 347 via the signal lines 378 and 379.

(2) Main Flip-Flops 340 to 344 and Spare Flip-Flops 345 to 347

The main flip-flops 340 to 344 and the spare flip-flops 345 to 347 are each a D-type flip-flop having a scan capability. Each flip-flop has the data input terminal D, the scan input terminal SI, the scan enable terminal SE, the data output terminal Q, the inverted data output terminal NQ, the clock input terminal CK, and the like, for external connection.

The main flip-flops 340 to 344 are used for realizing the original function of the subblocks 301b.

The spare flip-flops 345 to 347 are placed in the subblock 301b together with the main flip-flops 340 to 344 in areas where a correction is likely to be needed (e.g. areas where a lot of flip-flops are present), so that when a defect is found in the semiconductor integrated circuit 30, a correction can be made only by changing the metal wiring layer. The data input terminals D of the spare flip-flops 345 to 347 are each set to have an input of the logical value "0", so that the spare flip-flops 345 to 347 do not contribute to the original function of the subblock 301b. Also, the data output terminals Q and the inverted data output terminals NQ of the spare flip-flops 345 to 347 are not connected to anything, that is, the spare flip-flops 345 to 347 are open and floating.

(3) Connection Relationship of Each Cell

The clock input terminal 332 is connected to the input terminal of the CTS circuit 333 via the signal line 372. One output terminal of the CTS circuit 333 is connected to the clock input terminals CK of the main flip-flops 340, 341, and 342 and the spare flip-flop 345, via the signal line 379. The other output terminal of the CTS circuit 333 is connected to the clock input terminals CK of the main flip-flops 343 and 344 and the spare flip-flops 346 and 347, via the signal line 378.

The data output terminal Q of the main flip-flop 314 in the subblock 301a is connected to the data input terminal D of the main flip-flop 340 via the signal line 390. The data output terminal Q of the main flip-flop 340 is connected to the data input terminal D of the main flip-flop 341 via the signal line 391, the cell group 455, and the signal line 392. The data output terminal Q of the main flip-flop 341 is connected to the data input terminal D of the main flip-flop 342 via the signal line 393, the cell group 456, and the signal line 394. The data output terminal Q of the main flip-flop 342 is connected to the data input terminal D of the main flip-flop 343 via the signal line 395, the cell group 457, and the signal line 396. The data output terminal Q of the main flip-flop 343 is connected to the data input terminal D of the main flip-flop 344 via the signal line 397, the cell group 458, and the signal line 398. The data output terminal Q of the main flip-flop 344 is connected to the output terminal 402 via the signal line 399.

2.3. Construction of the Semiconductor Integrated Circuit after Changing the Metal Wiring Layer When a defect is found when using the semiconductor integrated circuit 30 having the above construction, the design of the metal wiring layer is changed to connect the data input terminal D, the data output terminal Q, and the inverted data output terminal NQ of any of the spare flip-flops 315 to 317 and 345 to 347 with other cells and the like, in order to eliminate the defect.

In a semiconductor integrated circuit 30a (not illustrated) fabricated after changing the design of the metal wiring layer, any of the spare flip-flops 315 to 317 and 345 to 347 is connected to other cells and the like through the metal wiring layer, and operates together with the main flip-flops 310 to 314 and 340 to 344 in sync with the clock signal output from the CTS circuit 303 or 333.

The following describes a functional block 301c in the semiconductor integrated circuit 30a, which corresponds to the functional block 301 in the semiconductor integrated circuit 30.

Figure 10:
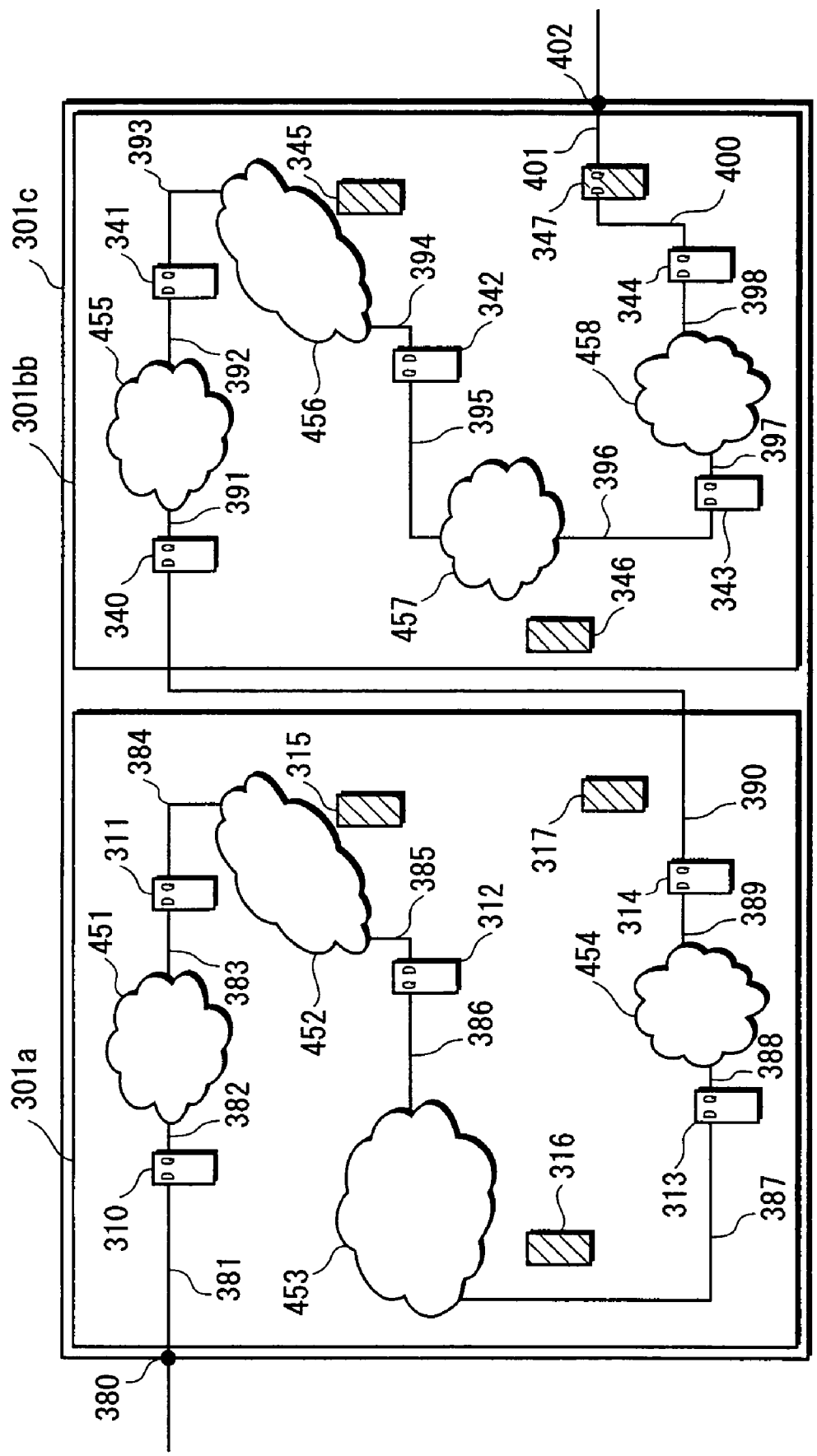
FIG. 10 is a simplified layout diagram mainly showing a main and spare function-based construction of a functional block in a semiconductor integrated circuit fabricated after changing a design of a metal wiring layer in the semiconductor integrated circuit of the second embodiment.

As shown in FIG. 10, the functional block 301c is roughly made of the subblock 301a and a subblock 301bb.

The subblock 301a is the same as the one shown in FIG. 9. That is, the subblock 301a has not been changed.

The design of the metal wiring layer is changed as follows. The signal line 399 which connects the data output terminal Q of the main flip-flop 344 and the output terminal 402 shown in FIG. 9 is removed. Instead, a signal line 400 which connects the data output terminal Q of the main flip-flop 344 and the data input terminal D of the spare flip-flop 347 and a signal line 401 which connects the data output terminal Q of the spare flip-flop 347 and the output terminal 402 are formed in the metal wiring layer.

As a result, the data output terminal Q of the main flip-flop 344 is connected to the data input terminal D of the spare flip-flop 347 via the signal line 400 and the data output terminal Q of the spare flip-flop 347 is connected to the output terminal 402 via the signal line 401 in the subblock 301bb, as shown in FIG. 10.

Note here that the other parts of the subblock 301bb are the same as those of the subblock 301b shown in FIG. 9.

2.4. Modification to the Second Embodiment

The following describes a functional block 301d in a semiconductor integrated circuit 30b (not illustrated) that is a modification to the second embodiment. The functional block 301d has the same construction as the functional block 301, and further has a function of performing a scan path test on the main flip-flops 310 to 314 and 340 to 344 and the spare flip-flops 315 to 317 and 345 to 347.

Figure 11:
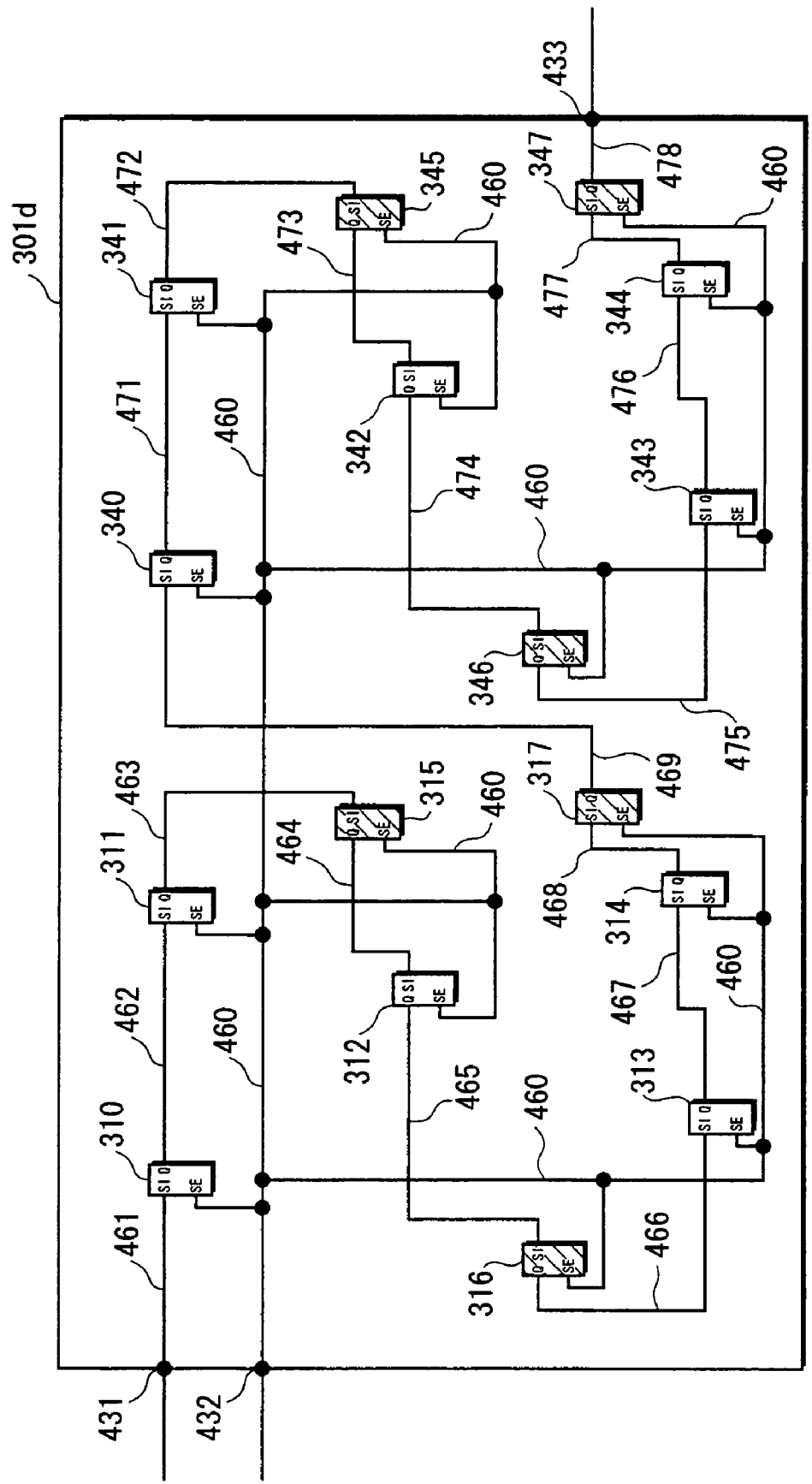
FIG. 11 is a simplified layout diagram mainly showing a scan-based construction of a functional block in a semiconductor integrated circuit which is a modification to the second embodiment.

FIG. 11 is a simplified layout diagram mainly showing a scan-based construction of the functional block 301d. In addition to the same construction as the functional block 301, the functional block 301d further includes a scan data input terminal 431, a scan enable signal input terminal 432, a signal line 460, signal lines 461 to 469, signal lines 471 to 478, and a scan data output terminal 433. In FIG. 11, construction elements which are the same as those shown in FIG. 8 have been given the same reference numerals, and their explanation has been omitted.

Here, the signal lines 461 to 469 and 471 to 478 are scan path wires, whilst the signal line 460 is a scan control signal wire.

The scan data input terminal 431 is connected to the scan input terminal SI of the main flip-flop 310 via the signal line 461. The data output terminal Q of the main flip-flop 310 is connected to the scan input terminal SI of the main flip-flop 311 via the signal line 462. The data output terminal Q of the main flip-flop 311 is connected to the scan input terminal SI of the spare flip-flop 315 via the signal line 463. The data output terminal Q of the spare flip-flop 315 is connected to the scan input terminal SI of the main flip-flop 312 via the signal line 464. The data output terminal Q of the main flip-flop 312 is connected to the scan input terminal SI of the spare flip-flop 316 via the signal line 465. The data output terminal Q of the spare flip-flop 316 is connected to the scan input terminal SI of the main flip-flop 313 via the signal line 466. The data output terminal Q of the main flip-flop 313 is connected to the scan input terminal SI of the main flip-flop 314 via the signal line 467. The data output terminal Q of the main flip-flop 314 is connected to the scan input terminal SI of the spare flip-flop 317 via the signal line 468. The data output terminal Q of the spare flip-flop 317 is connected to the scan input terminal SI of the main flip-flop 340 via the signal line 469.

The data output terminal Q of the main flip-flop 340 is connected to the scan input terminal SI of the main flip-flop 341 via the signal line 471. The data output terminal Q of the main flip-flop 341 is connected to the scan input terminal SI of the spare flip-flop 345 via the signal line 472. The data output terminal Q of the spare flip-flop 345 is connected to the scan input terminal SI of the main flip-flop 342 via the signal line 473. The data output terminal Q of the main flip-flop 342 is connected to the scan input terminal SI of the spare flip-flop 346 via the signal line 474. The data output terminal Q of the spare flip-flop 346 is connected to the scan input terminal SI of the main flip-flop 343 via the signal line 475. The data output terminal Q of the main flip-flop 343 is connected to the scan input terminal SI of the main flip-flop 344 via the signal line 476. The data output terminal Q of the main flip-flop 344 is connected to the scan input terminal SI of the spare flip-flop 347 via the signal line 477. The data output terminal Q of the spare flip-flop 347 is connected to the scan data output terminal 433 via the signal line 478.

The scan enable signal input terminal 432 is connected to the signal line 460, which is connected to the scan enable terminals SE of the main flip-flops 310 to 314 and 340 to 344 and the spare flip-flops 315 to 317 and 345 to 347.

The functional block 301d receives scan data from outside at the scan data input terminal 431. The received scan data is output to outside, via the signal line 461, the main flip-flop 310, the signal line 462, the main flip-flop 311, the signal line 463, the spare flip-flop 315, the signal line 464, the main flip-flop 312, the signal line 465, the spare flip-flop 316, the signal line 466, the main flip-flop 313, the signal line 467, the main flip-flop 314, the signal line 468, the spare flip-flop 317, the signal line 469, the main flip-flop 340, the signal line 471, the main flip-flop 341, the signal line 472, the spare flip-flop 345, the signal line 473, the main flip-flop 342, the signal line 474, the spare flip-flop 346, the signal line 475, the main flip-flop 343, the signal line 476, the main flip-flop 344, the signal line 477, the spare flip-flop 347, the signal line 478, and the scan data output terminal 433.

Also, the functional block 301d receives a scan enable signal from outside at the scan enable signal input terminal 432. The received scan enable signal is fed to the scan enable terminals SE of the main flip-flops 310 to 314 and 340 to 344 and the spare flip-flops 315 to 317 and 345 to 347, via the signal line 460. The scan enable signal takes one of the logical values "1" and "0". The scan enable signal has already been explained and so its further explanation has been omitted here.

If the scan enable signal input in the scan enable signal input terminal 432 is "1", each of the main flip-flops 310 to 314 and 340 to 344 and the spare flip-flops 315 to 317 and 345 to 347 performs a scan shift operation. If the scan enable signal input in the scan enable signal input terminal 432 is "0", each of the main flip-flops 310 to 314 and 340 to 344 and the spare flip-flops 315 to 317 and 345 to 347 performs a normal operation.

Conclusion on the Modification

As described above, when the functional block 301d receives the scan enable signal which is "1" at the scan enable signal input terminal 432, all of the main flip-flops 310 to 314 and 340 to 344 and the spare flip-flops 315 to 317 and 345 to 347 enter into a scan shift operation mode. As a result, the scan data signal input in the scan data input terminal 431 travels through a scan path formed by connecting in series the main flip-flop 310, the main flip-flop 311, the spare flip-flop 315, the main flip-flop 312, the spare flip-flop 316, the main flip-flop 313, the main flip-flop 314, the spare flip-flop 317, the main flip-flop 340, the main flip-flop 341, the spare flip-flop 345, the main flip-flop 342, the spare flip-flop 346, the main flip-flop 343, the main flip-flop 344, and the spare flip-flop 347, and is output to outside from the scan data output terminal 433.

Even when it becomes necessary to modify the operation of the functional block 301d by changing the mask of the metal wiring layer so as to use any of the spare flip-flops 315 to 317 and 345 to 347, the spare flip-flops 315 to 317 and 345 to 347 have already been designed to receive the scan enable signal, and also a scan data chain has already been established. Accordingly, there is no need to change the mask of the metal wiring layer with regard to scan.

2.5. Design Procedure

Figure 12:
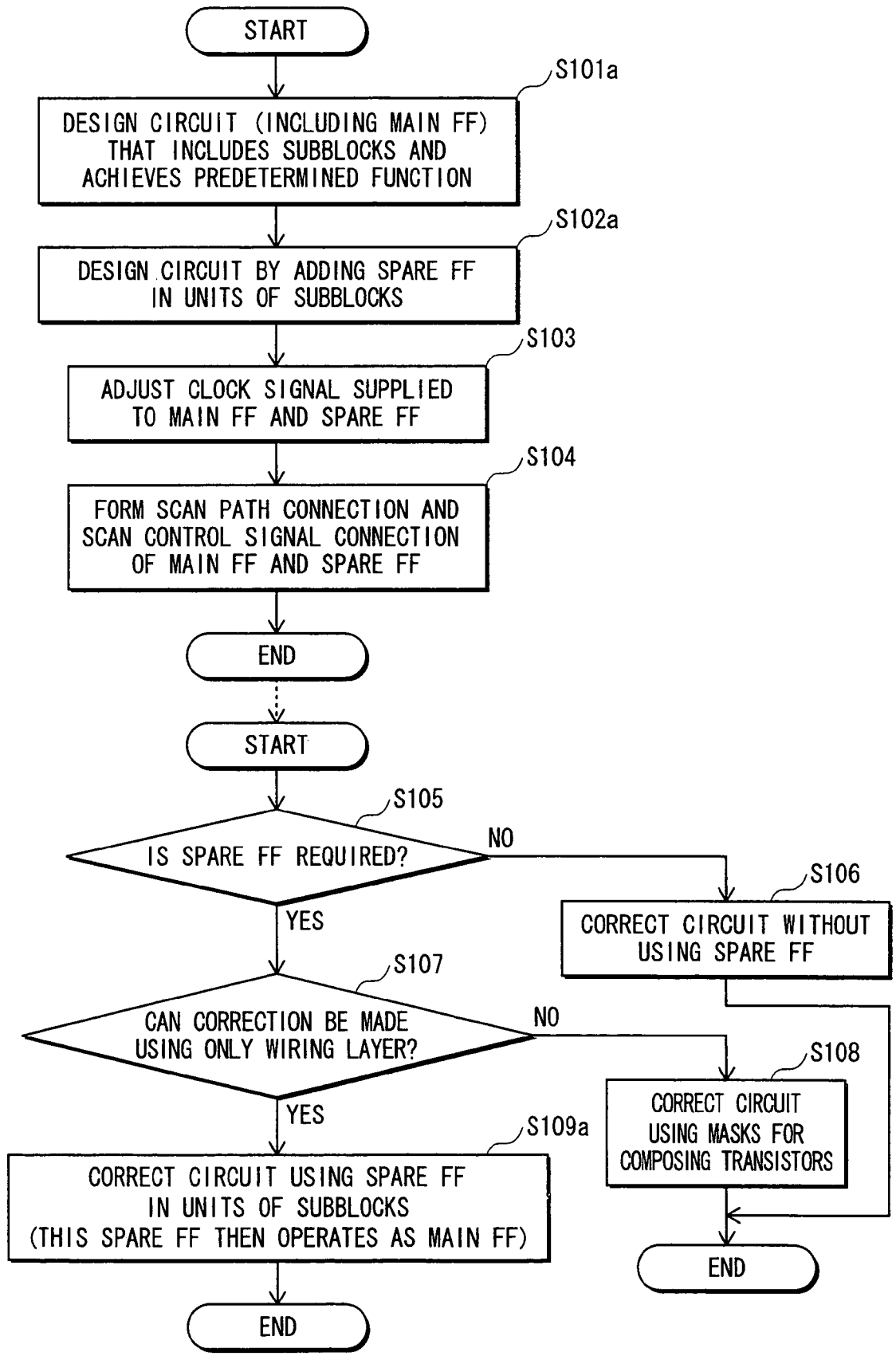
FIG. 12 is a flowchart showing a design procedure of the semiconductor integrated circuit which is the modification to the second embodiment.

A design procedure of the semiconductor integrated circuit 30b which is the modification to the second embodiment is described below, with reference to a flowchart shown in FIG. 12.

First, a circuit design for realizing the predetermined function is performed, including subblocks. In detail, a layout design of placing standard cells such as main flip-flops, ANDs, and NORs is performed (S101a).

Next, a layout design of additionally placing standard cells, such as spare flip-flops, ANDS, and NORs, in areas not occupied by the main standard cells placed in step S101a is performed in units of subblocks (S102a).

After this, the clock signal is adjusted for synchronizing the main flip-flops and the spare flip-flops, by adjusting the layout of standard cells and wires (S103).

Further, signal lines for scan path connection and scan control signal connection of the main flip-flops and the spare flip-flops are laid out (S104).

As a result, a layout design in which the main flip-flops and the spare flip-flops are placed is completed. The semiconductor integrated circuit 30b is fabricated based on this design.

When a defect is found in a test or the like of the fabricated semiconductor integrated circuit 30b, a correction is made in the following manner.

A judgment is made on whether the correction requires any of the spare flip-flops (S105). If the judgment is negative (S105: NO), the correction is made without using any of the spare flip-flops (S106).

If the correction requires any of the spare flip-flops (S105: YES), a judgment is made on whether the correction can be made by changing only the metal wiring layer (S107). If the judgment is negative (S107: NO), the correction is made involving the masks for composing transistors, by changing the diffusion layer by addition of a transistor or the like (S108).

If the correction can be made by changing only the metal wiring layer (S107: YES), the correction is made in units of subblocks by connecting any of the spare standard cells with a wire in the metal wiring layer (S109a). The connected spare flip-flop becomes a main flip-flop.

2.6. Conclusion on the Second Embodiment and its Modification

The second embodiment and its modification describe the case where the clock signal is adjusted so that the main flip-flops and the spare flip-flops in both subblocks operate synchronously. However, this is not a limit for the present invention, as the main flip-flops and the spare flip-flops in one subblock may not necessarily be synchronized with the main flip-flops and the spare flip-flops in another subblock.

According to the second embodiment and its modification, the spare flip-flops 315 to 317 and 345 to 347 are placed in the functional block 301 or 301d in areas where a correction is likely to be needed, so that when a defect is found in the semiconductor integrated circuit 30 or 30b, a correction can be made by changing only the metal wiring layer. Also, the data input terminals D of the spare flip-flops 315 to 317 and 345 to 347 are each set to have an input of the logical value "0".

According to the second embodiment and its modification, the spare flip-flops 315 to 317 each receive, at its clock input terminal CK, the gated clock signal output from the CTS circuit 303. Also, the spare flip-flops 345 to 347 each receive, at its clock input terminal CK, the gated clock signal output from the CTS circuit 333.

The second embodiment and its modification described above achieve the same effects as the first embodiment and its modification. Furthermore, the second embodiment and its modification achieve the following effects.

According to the conventional technique, a spare flip-flop is not supplied with a clock signal and therefore consumes no power, when there is no design change. Once a design change has been made to use the spare flip-flop, the spare flip-flop begins to operate constantly, thereby consuming power. In the first embodiment, the adjusted clock signal is supplied to the spare flip-flop irrespective of whether the spare flip-flop is used or unused, which causes a waste of power. In the second embodiment, on the other hand, the spare flip-flop is subjected to clock gating. Accordingly, even when a design change has been made to use the spare flip-flop, the spare flip-flop can be controlled to operate only when necessary, with it being possible to reduce power consumption.

3. Third Embodiment

The following describes a semiconductor integrated circuit 50 (not illustrated) according to a third embodiment of the present invention. To achieve a desired function, the semiconductor integrated circuit 50 is formed by a plurality of layers including at least one cell placement layer where a plurality of standard cells (such as flip-flops and inverters) are placed, and at least one metal wiring layer. Each cell is connected to another cell and the like, via a signal line formed in the metal wiring layer. The semiconductor integrated circuit 50 is roughly made up of a plurality of functional blocks including functional blocks 501 and 601.

3.1. Construction of the Functional Block 601

Figure 13:
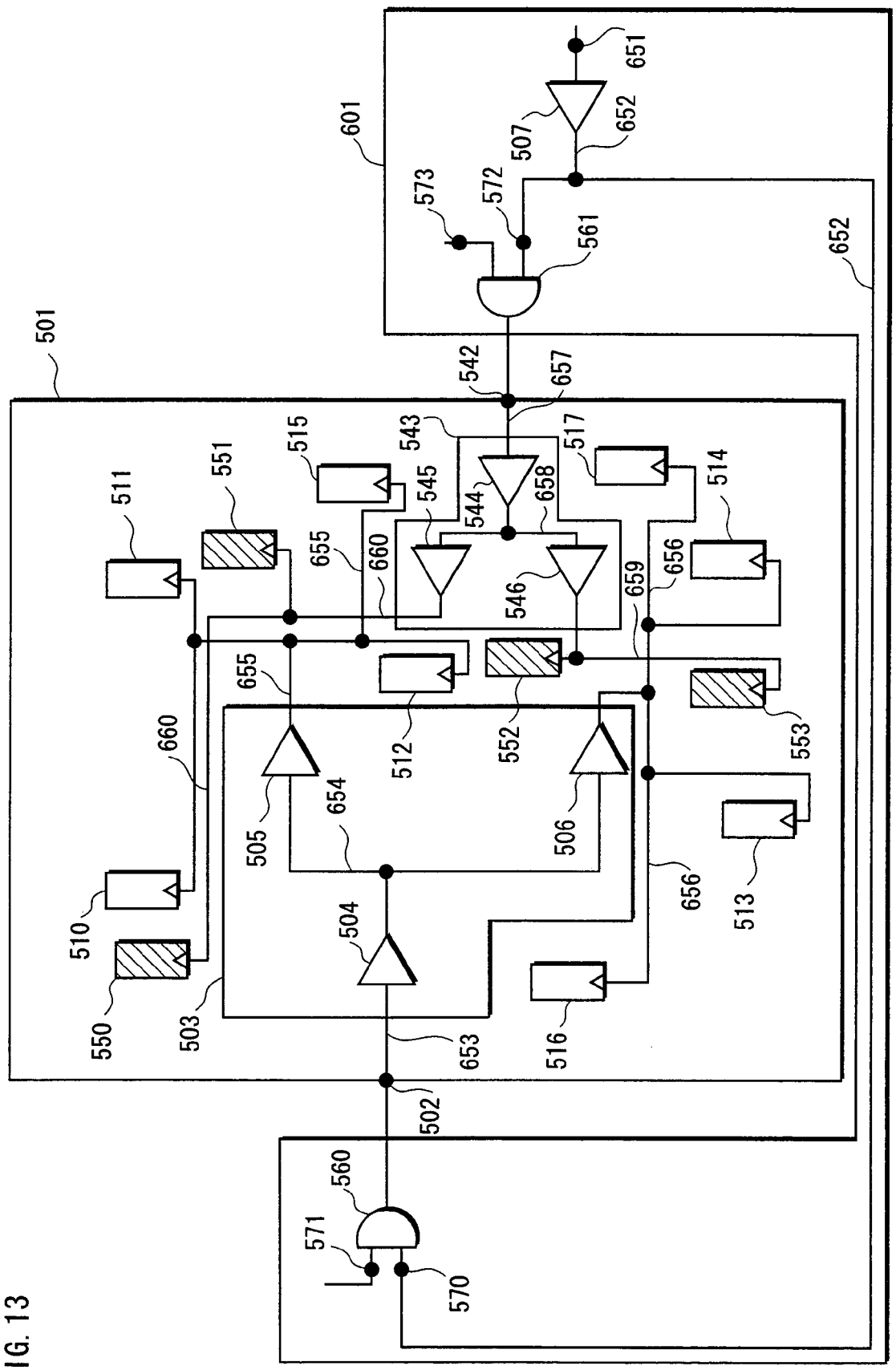
FIG. 13 is a simplified layout diagram mainly showing clock-based constructions of functional blocks in a semiconductor integrated circuit of a third embodiment of the present invention.

FIG. 13 is a simplified layout diagram mainly showing a construction of the functional block 601 and a clock-based construction of the functional block 501. In the drawing, the functional block 601 includes an input terminal 651, a clock buffer 507, a signal line 652, clock gating circuits 560 and 561, and other circuits (not illustrated).

The input terminal 651 is connected to an input terminal of the clock buffer 507 via a signal line, and an output terminal of the clock buffer 507 is connected to a clock terminal 570 of the clock gating circuit 560 and a clock terminal 572 of the clock gating circuit 561, via the signal line 652. Output terminals of the clock gating circuits 560 and 561 are connected respectively to clock input terminals 502 and 542 of the functional block 501.

The clock gating circuit 560 gates (enables or disables) a clock signal received at the clock terminal 570, in accordance with an enable signal received at an enable signal input terminal 571. The clock gating circuit 560 outputs the gated clock signal to the clock input terminal 502 of the functional block 501. The gated clock signal referred to here is a clock signal a supply of which is controlled.

The clock gating circuit 561 gates the clock signal received at the clock terminal 572, in accordance with an enable signal received at an enable signal input terminal 573. The clock gating circuit 561 outputs the gated clock signal to the clock input terminal 542 of the functional block 501. The enable signal received at the enable signal input terminal 573 is held at the logical value "0". The logical value "0" instructs not to supply the clock signal. Since the clock gating circuit 561 gates the clock signal to spare flip-flops 550 to 553 in the functional block 501, the clock signal to the spare flip-flops 550 to 553 is constantly disabled.

Here, the enable signal received at the enable signal input terminal 573 may instead be held at the logical value "1". The logical value "1" instructs to supply the clock signal. In this case, the clock signal to the spare flip-flops 550 to 553 is constantly enabled.

3.2. Construction of the Functional Block 501

Regarding the clock-based construction, the functional block 501 includes the clock input terminal 502, a signal line 653, a CTS circuit 503, signal lines 655 and 656, main flip-flops 510 to 517, the clock input terminal 542, a signal line 657, a CTS circuit 543, signal lines 659 and 660, and the spare flip-flops 550 to 553, as shown in FIG. 13.

Figure 14:
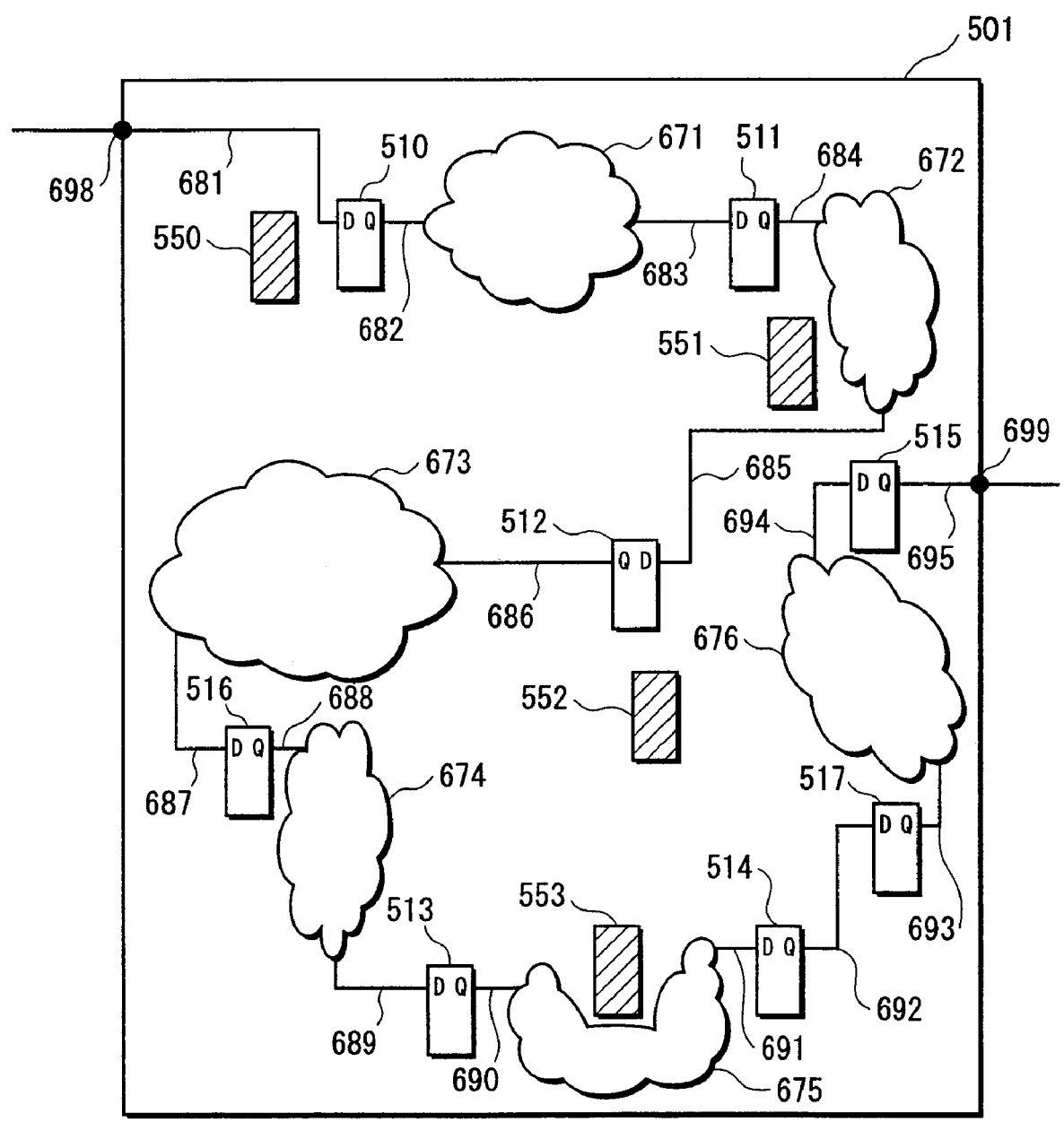
FIG. 14 is a simplified layout diagram mainly showing a main and spare function-based construction of one of the functional blocks in the semiconductor integrated circuit of the third embodiment.

FIG. 14 is a simplified layout diagram mainly showing a main and spare function-based construction of the functional block 501. Regarding the main and spare function-based construction, the functional block 501 includes an input terminal 698, the main flip-flops 510 to 517, the spare flip-flops 550 to 553, cell groups 671 to 676 which are each made up of one or more cells, signal lines 681 to 695, and an output terminal 699, as shown in FIG. 14.

(1) Constructions of the CTS Circuits 503 and 543

The CTS circuit 503 is formed by connecting clock buffers in a tree form so as to distribute a clock signal. As shown in FIG. 13, the CTS circuit 503 is roughly made up of clock buffers 504 to 506 and a signal line 654, and has one input terminal and two output terminals. The clock input terminal 502 is connected to an input terminal of the clock buffer 504, and an output terminal of the clock buffer 504 is connected to the signal line 654. The signal line 654 is connected to input terminals of the clock buffers 505 and 506, and output terminals of the clock buffers 505 and 506 are connected respectively to the signal lines 655 and 656.

Thus, the clock buffers 504 to 506 form a clock tree structure in which the clock buffer 504 is a root and the clock buffers 505 and 506 are leaves.

Driving capacities of the clock buffers 504 to 506 and a wire length of the signal line 654 are adjusted so that the clock signal is supplied to the main flip-flops 510 to 517 in the functional block 501 within a predetermined amount of clock skew.

With this construction, the CTS circuit 503 adjusts the clock signal received from the functional block 601 via the clock input terminal 502, and outputs the adjusted clock signal to outside.

The CTS circuit 543 is formed by connecting clock buffers in a tree form so as to distribute a clock signal. As shown in FIG. 13, the CTS circuit 543 is roughly made up of clock buffers 544 to 546 and a signal line 658, and has one input terminal and two output terminals. The clock input terminal 542 is connected to an input terminal of the clock buffer 544, and an output terminal of the clock buffer 544 is connected to the signal line 658. The signal line 658 is connected to input terminals of the clock buffers 545 and 546, and output terminals of the clock buffers 545 and 546 are connected respectively to the signal lines 660 and 659.

Thus, the clock buffers 544 to 546 form a clock tree structure in which the clock buffer 544 is a root and the clock buffers 545 and 546 are leaves.

Driving capacities of the clock buffers 544 to 546 and a wire length of the signal line 658 are adjusted so that the clock signal is supplied to the spare flip-flops 550 to 553 in the functional block 501 within a predetermined amount of clock skew.

With this construction, the CTS circuit 543 adjusts the clock signal received from the functional block 601 via the clock input terminal 542, and outputs the adjusted clock signal to outside.

Though the CTS circuits 503 and 543 perform timing adjustment based on different inputs of gated clock signals, the clock signals are adjusted so that all of the main flip-flops 510 to 517 and the spare flip-flops 550 to 553 operate synchronously.

(2) Main Flip-Flops 510 to 517 and Spare Flip-Flops 550 to 553

The main flip-flops 510 to 517 and the spare flip-flops 550 to 553 are each a D-type flip-flop having a scan capability. Each flip-flop has the data input terminal D, the scan input terminal SI, the scan enable terminal SE, the data output terminal Q, the inverted data output terminal NQ, the clock input terminal CK, and the like, for external connection.

The main flip-flops 510 to 517 are used to realize the original function of the functional block 501.

The spare flip-flops 550 to 553 are placed in the functional block 501 together with the main flip-flops 510 to 517 in areas where a correction is likely to be needed (e.g. areas where a lot of flip-flops are present), so that when a defect is found in the semiconductor integrated circuit 50, a correction can be made by changing only the metal wiring layer. The data input terminals D of the spare flip-flops 550 to 553 are each set to have an input of the logical value "0", so that the spare flip-flops 550 to 553 do not contribute to the original function of the functional block 501. Also, the data output terminals Q and the inverted data output terminals NQ of the spare flip-flops 550 to 553 are not connected to anything, that is, the spare flip-flops 550 to 553 are open and floating.

(3) Connection Relationship of Each Cell

The clock input terminal 502 is connected to the input terminal of the CTS circuit 503 via the signal line 653. One output terminal of the CTS circuit 503 is connected to the clock input terminals CK of the main flip-flops 510 to 512 and 515 via the signal line 655. The other output terminal of the CTS circuit 503 is connected to the clock input terminals CK of the main flip-flops 513, 514, 516, and 517 via the signal line 656.

The clock input terminal 542 is connected to the input terminal of the CTS circuit 543 via the signal line 657. One output terminal of the CTS circuit 543 is connected to the clock input terminals CK of the spare flip-flops 550 and 551 via the signal line 660. The other output terminal of the CTS circuit 543 is connected to the clock input terminals CK of the spare flip-flops 552 and 553 via the signal line 659.

The input terminal 698 is connected to the data input terminal D of the main flip-flop 510 via the signal line 681. The data output terminal Q of the main flip-flop 510 is connected to the data input terminal D of the main flip-flop 511 via the signal line 682, the cell group 671, and the signal line 683. The data output terminal Q of the main flip-flop 511 is connected to the data input terminal D of the main flip-flop 512 via the signal line 684, the cell group 672, and the signal line 685. The data output terminal Q of the main flip-flop 512 is connected to the data input terminal D of the main flip-flop 516 via the signal line 686, the cell group 673, and the signal line 687. The data output terminal Q of the main flip-flop 516 is connected to the data input terminal D of the main flip-flop 513 via the signal line 688, the cell group 674, and the signal line 689. The data output terminal Q of the main flip-flop 513 is connected to the data input terminal D of the main flip-flop 514 via the signal line 690, the cell group 675, and the signal line 691. The data output terminal Q of the main flip-flop 514 is connected to the data input terminal D of the main flip-flop 517 via the signal line 692. The data output terminal Q of the main flip-flop 517 is connected to the data input terminal D of the main flip-flop 515 via the signal line 693, the cell group 676, and the signal line 694. The data output terminal Q of the main flip-flop 515 is connected to the output terminal 699 via the signal line 695.

3.3. Construction of the Semiconductor Integrated Circuit after Changing the Metal Wiring Layer If a defect is found when using the semiconductor integrate circuit 50 having the above construction, the design of the metal wiring layer is changed to connect the data input terminal D, the data output terminal Q, and the inverted data output terminal NQ of any of the spare flip-flops 550 to 553 with other cells and the like, in order to eliminate the defect.

In a semiconductor integrated circuit 50a (not illustrated) fabricated after changing the design of the metal wiring layer, any of the spare flip-flops 550 to 553 is connected to other cells and the like through the metal wiring layer, and operates together with the main flip-flops 510 to 517 in sync with the clock signal output from the CTS circuit 543.

The following describes a functional block 501a in the semiconductor integrated circuit 50a, which corresponds to the functional block 501 in the semiconductor integrated circuit 50.

The design of the metal wiring layer is changed as follows. The signal line 681 which connects the input terminal 698 and the data input terminal D of the main flip-flop 510 shown in FIG. 14 is removed. Instead, a signal line 696 which connects the input terminal 698 and the data input terminal D of the spare flip-flop 550 and a signal line 697 which connects the data output terminal Q of the spare flip-flop 550 and the data input terminal D of the main flip-flop 510 are formed in the metal wiring layer.

Figure 15:
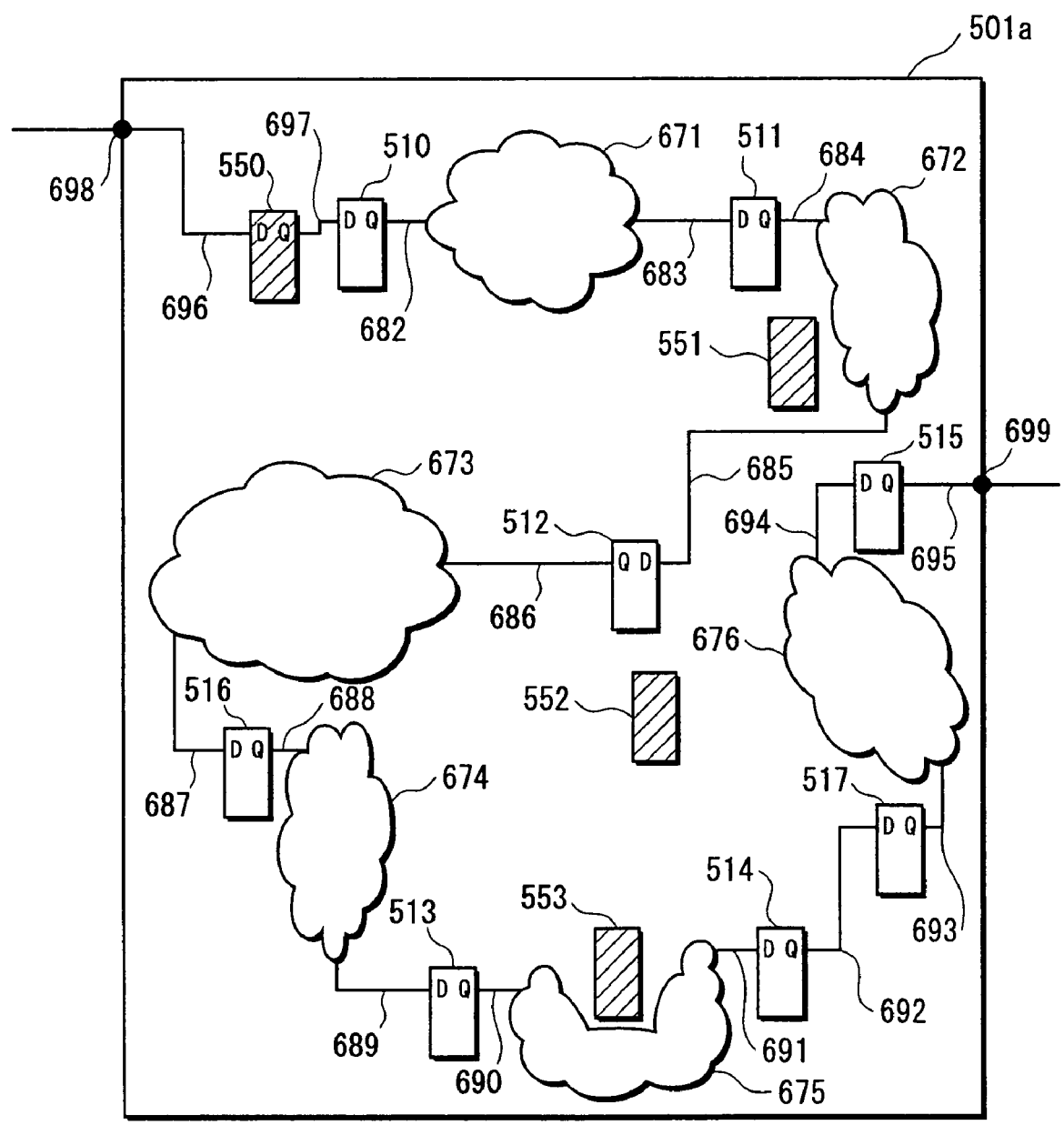
FIG. 15 is a simplified layout diagram mainly showing a main and spare function-based construction of a functional block in a semiconductor integrated circuit fabricated after changing a design of a metal wiring layer in the semiconductor integrated circuit of the third embodiment.

As a result, the input terminal 698 is connected to the data input terminal D of the spare flip-flop 550 via the signal line 696 and the data output terminal Q of the spare flip-flop 550 is connected to the data input terminal D of the main flip-flop 510 via the signal line 697 in the functional block 501a, as shown in FIG. 15.

Note here that the other parts of the functional block 501a are the same as those of the functional block 501 shown in FIG. 14.

3.4. Modification to the Third Embodiment

The following describes a functional block 501b in a semiconductor integrated circuit 50b (not illustrated) that is a modification to the third embodiment. The functional block 501b has the same construction as the functional block 501, and further has a function of performing a scan path test on the main flip-flops 510 to 517 and the spare flip-flops 550 to 553.

Figure 16:
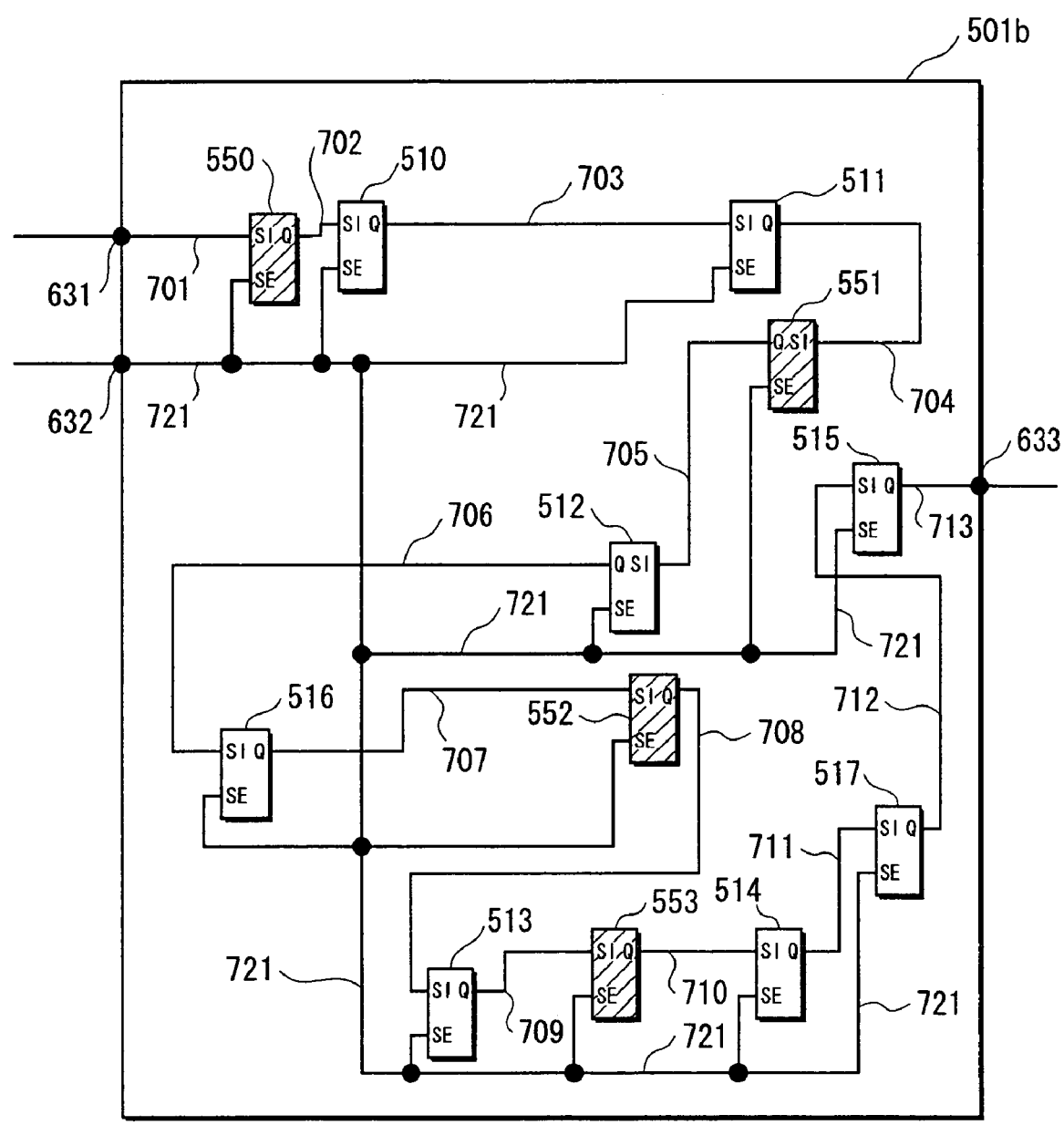
FIG. 16 is a simplified layout diagram mainly showing a scan-based construction of a functional block in a semiconductor integrated circuit which is a modification to the third embodiment.

FIG. 16 is a simplified layout diagram mainly showing a scan-based construction of the functional block 501b. In addition to the same construction as the functional block 501, the functional block 501b includes a scan data input terminal 631, a scan enable signal input terminal 632, signal lines 701 to 713, a signal line 721, and a scan data output terminal 633. In FIG. 16, construction elements which are the same as those shown in FIG. 13 have been given the same reference numerals, and their explanation has been omitted.

Here, the signal lines 701 to 713 are scan path wires, and the signal line 721 is a scan control signal wire.

The scan data input terminal 631 is connected to the scan input terminal SI of the spare flip-flop 550 via the signal line 701. The data output terminal Q of the spare flip-flop 550 is connected to the scan input terminal SI of the main flip-flop 510 via the signal line 702. The data output terminal Q of the main flip-flop 510 is connected to the scan input terminal SI of the main flip-flop 511 via the signal line 703. The data output terminal Q of the main flip-flop 511 is connected to the scan input terminal SI of the spare flip-flop 551 via the signal line 704. The data output terminal Q of the spare flip-flop 551 is connected to the scan input terminal SI of the main flip-flop 512 via the signal line 705. The data output terminal Q of the main flip-flop 512 is connected to the scan input terminal SI of the main flip-flop 516 via the signal line 706. The data output terminal Q of the main flip-flop 516 is connected to the scan input terminal SI of the spare flip-flop 552 via the signal line 707. The data output terminal Q of the spare flip-flop 552 is connected to the scan input terminal SI of the main flip-flop 513 via the signal line 708. The data output terminal Q of the main flip-flop 513 is connected to the scan input terminal SI of the spare flip-flop 553 via the signal line 709. The data output terminal Q of the spare flip-flop 553 is connected to the scan input terminal SI of the main flip-flop 514 via the signal line 710. The data output terminal Q of the main flip-flop 514 is connected to the scan input terminal SI of the main flip-flop 517 via the signal line 711. The data output terminal Q of the main flip-flop 517 is connected to the scan input terminal SI of the main flip-flop 515 via the signal line 712. The data output terminal Q of the main flip-flop 515 is connected to the scan data output terminal 633 via the signal line 713.

The scan enable signal input terminal 632 is connected to the signal line 721, which is connected to the scan enable terminals SE of the main flip-flops 510 to 517 and the spare flip-flops 550 to 553.

The functional block 501b receives scan data from outside at the scan data input terminal 631. The received scan data is output to outside via the signal line 701, the spare flip-flop 550, the signal line 702, the main flip-flop 510, the signal line 703, the main flip-flop 511, the signal line 704, the spare flip-flop 551, the signal line 705, the main flip-flop 512, the signal line 706, the main flip-flop 516, the signal line 707, the spare flip-flop 552, the signal line 708, the main flip-flop 513, the signal line 709, the spare flip-flop 553, the signal line 710, the main flip-flop 514, the signal line 711, the main flip-flop 517, the signal line 712, the main flip-flop 515, the signal line 713, and the scan data output terminal 633.

The functional block 501b also receives a scan enable signal from outside at the scan enable signal input terminal 632. The received scan enable signal is fed to the scan enable terminals SE of the main flip-flops 510 to 517 and the spare flip-flops 550 to 553 via the signal line 721. The scan enable signal takes one of the logical values "1" and "0". The scan enable signal has already been explained and so its further explanation has been omitted here.

When the scan enable signal input in the scan enable signal input terminal 632 is "1", the main flip-flops 510 to 517 and the spare flip-flops 550 to 553 each perform a scan shift operation. When the scan enable signal input in the scan enable signal input terminal 632 is "0", the main flip-flops 510 to 517 and the spare flip-flops 550 to 553 each perform a normal operation.

Conclusion on the Modification

As described above, when the functional block 501b receives the scan enable signal which is "1" at the scan enable signal input terminal 632, all of the main flip-flops 510 to 517 and the spare flip-flops 550 to 553 enter into a scan shift operation mode. As a result, the scan data signal input in the scan data input terminal 631 travels through a scan path formed by connecting in series the spare flip-flop 550, the main flip-flop 510, the main flip-flop 511, the spare flip-flop 551, the main flip-flop 512, the main flip-flop 516, the spare flip-flop 552, the main flip-flop 513, the spare flip-flop 553, the main flip-flop 514, the main flip-flop 517, and the main flip-flop 515, and is output from the scan data output terminal 633 to outside.

Even when it becomes necessary to modify the operation of the functional block 501b by changing the mask of the metal wiring layer so as to use any of the spare flip-flops 550 to 553, the spare flip-flops 550 to 553 have already been designed to receive the scan enable signal, and also a scan data chain has already been established. Hence there is no need to change the mask of the metal wiring layer with regard to scan.

3.5. Conclusion on the Third Embodiment and its Modification

According to the third embodiment and its modification, the gated clock signal from the clock input terminal 542 is supplied only to the spare flip-flops 550 to 553 via the CTS circuit 543. In other words, the spare flip-flops 550 to 553 themselves form one subblock. The gated clock signal from the clock input terminal 542 is not supplied to the main flip-flops 510 to 517.

Accordingly, when there is no functional change, the spare flip-flops 550 to 553 are stopped together by constantly negating the enable signal input in the enable signal input terminal 573. This represents a significant saving in power.

Even when a functional change becomes necessary, the timing adjustment has already been made between the main flip-flops 510 to 517 connected with the CTS circuit 503 and the spare flip-flops 550 to 553 connected with the CTS circuit 543. Hence a design time can be shortened.

The third embodiment and its modification achieve the same effects as the second embodiment and its modification. Furthermore, the third embodiment and its modification provide the gated clock signal which is adjusted and supplied only to the spare flip-flops, so that the spare flip-flops can be stopped together when there is no functional change. This represents a further saving in power.

4. Other Modifications

Though the present invention has been described by way of the above embodiments and their modifications, the present invention is not limited to the above. Example modifications are given below.

(1) In the above embodiments and their modifications, the logical values "0" and "1" may be interchanged.

In more detail, the above embodiments and their modifications describe the case where the main flip-flops and the spare flip-flops perform a scan shift operation when the scan enable signal is "1", and a normal operation when the scan enable signal is "0". As an alternative, the main flip-flops and the spare flip-flops may perform a normal operation when the scan enable signal is "1" and a scan shift operation when the scan enable signal is "0".

(2) The above embodiments and their modifications describe the case where each CTS circuit is positioned in the same functional block as flip-flops, but an additional functional block which contains only a group of CTS circuits may be provided to supply clock signals to corresponding functional blocks.

The above embodiments and their modifications describe the case where each CTS circuit forms a clock tree structure of two levels (two stages), but this is not a limit for the present invention. For instance, the CTS circuit may be formed by connecting clock buffers in three levels or more, i.e. three stages or more.

(3) The above embodiments and their modifications describe the case where the spare flip-flops are placed in the same functional block as the main flip-flops, but this is not a limit for the present invention. For instance, the spare flip-flops may be collectively placed in a functional block near the functional block which contains the main flip-flops.

(4) Instead of performing both adjusted clock signal connection and scan path connection for the spare flip-flops, only one of these connections may be performed for the spare flip-flops. This results in a saving in design time taken for routing.

(5) The above embodiments and their modifications describe the case where the data output terminal and the inverted data output terminal of each spare flip-flop are connected to nothing.

Alternatively, the data output terminal and the inverted data output terminal of each spare flip-flop may be connected to nothing except the scan input terminal of a main flip-flop or another spare flip-flop.

(6) The second embodiment and its modification can be modified as follows. The functional block 411 is replaced with another functional block which supplies the clock signal to the clock input terminal 302 of the functional block 301 in a predetermined period, and supplies the clock signal to the clock input terminal 332 of the functional block 301 in another predetermined period.

(7) The above embodiments and their modifications may be freely combined. As one example, a construction in which one clock signal supply path is not gated, another clock signal supply path is gated and connected to both the main flip-flops and the spare flip-flops, and yet another clock signal supply path is connected only to the spare flip-flops.

The present invention contributes to both lower power consumption and a shorter design time, and can be used for a semiconductor integrated circuit that uses repair cells.

The semiconductor integrated circuit according to the present invention can be manufactured and sold recurrently and continuously in an electrical device manufacturing industry. Also, in a state of being incorporated in various electrical devices, the semiconductor integrated circuit according to the present invention can be used recurrently and continuously in any industry that uses electrical devices.

Although the present invention has been fully described by way of examples with reference to the accompanying drawings, it is to be noted that various changes and modifications will be apparent to those skilled in the art.

Therefore, unless such changes and modifications depart from the scope of the present invention, they should be construed as being included therein.

What is claimed is:

1. A semiconductor integrated circuit designed to realize a predetermined function, comprising:
   a plurality of main flip-flops used for realizing the predetermined function;
   a plurality of spare flip-flops; and
   a clock adjustment circuit operable to generate a clock signal which is adjusted for synchronizing the plurality of main flip-flops and the plurality of spare flip-flops, and supply the adjusted clock signal to the plurality of main flip-flops and the plurality of spare flip-flops, wherein
   a data input terminal of each of the plurality of spare flip-flops continuously receives an input of a fixed logical value.

2. The semiconductor integrated circuit of claim 1, wherein a data output terminal of each of the plurality of spare flip-flops is not connected to any terminal of another flip-flop except a scan input terminal.

3. The semiconductor integrated circuit of claim 1, being composed of a plurality of functional blocks,
   wherein the plurality of spare flip-flops are contained in a functional block in which the plurality of main flip-flops are contained, or in a neighboring functional block of the functional block.

4. The semiconductor integrated circuit of claim 1,
   wherein the clock adjustment circuit includes a plurality of clock buffers arranged in a tree form.

5. A semiconductor integrated circuit designed to realize a predetermined function, comprising:
   a plurality of main flip-flops used for realizing the predetermined function;
   a plurality of spare flip-flops;
   a clock adjustment circuit operable to generate a clock signal which is adjusted for synchronizing the plurality of main flip-flops and the plurality of spare flip-flops, and supply the adjusted clock signal to the plurality of main flip-flops and the plurality of spare flip-flops; and
   at least one of a scan path wire and a scan control signal wire, the scan path wire connecting the plurality of main flip-flops and the plurality of spare flip-flops in series, and the scan control signal wire being connected to each of the plurality of main flip-flops and each of the plurality of spare flip-flops.

6. A semiconductor integrated circuit designed to realize a predetermined function, comprising:
   a plurality of main flip-flops used for realizing the predetermined function;
   a plurality of spare flip-flops; and
   a clock adjustment circuit operable to generate a clock signal which is adjusted for synchronizing the plurality of main flip-flops and the plurality of spare flip-flops, and supply the adjusted clock signal to the plurality of main flip-flops and the plurality of spare flip-flops; and
   a clock supply control circuit,
   wherein the semiconductor integrated circuit is composed of a plurality of functional blocks,
   the plurality of spare flip-flops are contained in a functional block in which the plurality of main flip-flops are contained, or in a neighboring functional block of the functional block,
   the functional block includes a plurality of subblocks which each operate in a predetermined period, and
   the clock supply control circuit is operable to control supply of the clock signal to each of the plurality of subblocks.

7. The semiconductor integrated circuit of claim 6, wherein the plurality of main flip-flops and the plurality of spare flip-flops are contained in a subblock out of the plurality of subblocks, and
   the clock supply control circuit stops supplying the clock signal to the subblock in a period when the subblock does not operate.

8. The semiconductor integrated circuit of claim 6, wherein the clock supply control circuit includes a logic circuit operable to supply or stop supplying the clock signal to each of the plurality of subblocks according to an enable signal.

9. The semiconductor integrated circuit of claim 6, wherein the plurality of spare flip-flops are contained in a different subblock from the plurality of main flip-flops, and
   the clock supply control circuit includes a logic circuit operable to supply or stop supplying the clock signal to the subblock according to an enable signal.

10. The semiconductor integrated circuit of claim 9, wherein the enable signal indicates to stop supplying the clock signal, and
    the logic circuit continuously stops supplying the clock signal to the subblock according to the enable signal.

* * * * *